United States Patent
Folts et al.

(10) Patent No.: US 7,724,482 B2
(45) Date of Patent: May 25, 2010

(54) PARALLEL HTS TRANSFORMER DEVICE

(75) Inventors: Douglas C. Folts, Baraboo, WI (US); James Maguire, Andover, MA (US); Jie Yuan, South Grafton, MA (US); Alexis P. Malozemoff, Lexington, MA (US)

(73) Assignee: American Superconductor Corporation, Westborough, MA (US)

( * ) Notice: Subject to any disclaimer, the term of this patent is extended or adjusted under 35 U.S.C. 154(b) by 0 days.

(21) Appl. No.: 11/688,827

(22) Filed: Mar. 20, 2007

(65) Prior Publication Data

US 2008/0192392 A1    Aug. 14, 2008

Related U.S. Application Data

(63) Continuation-in-part of application No. 11/673,281, filed on Feb. 9, 2007.

(51) Int. Cl.
*H02H 7/00* (2006.01)
(52) U.S. Cl. .................... 361/19; 361/93.9; 307/147
(58) Field of Classification Search ............... 361/19, 361/93.9; 307/147
See application file for complete search history.

(56) References Cited

U.S. PATENT DOCUMENTS

| | | | |
|---|---|---|---|
| 5,801,124 | A | 9/1998 | Gamble et al. |
| 5,859,386 | A | 1/1999 | Herrmann et al. |
| 6,230,033 | B1 | 5/2001 | Scudiere et al. |
| 6,444,917 | B1 | 9/2002 | Scudiere et al. |
| 6,649,280 | B1 | 11/2003 | Scudiere et al. |
| 7,521,082 | B2 * | 4/2009 | Selvamanickam ............ 427/62 |

(Continued)

FOREIGN PATENT DOCUMENTS

EP    1376709 A1    1/2004

(Continued)

OTHER PUBLICATIONS

Abstract for JP2005-5150469. Jun. 9, 2005.*

(Continued)

*Primary Examiner*—Jared J Fureman
*Assistant Examiner*—Christopher J Clark
(74) *Attorney, Agent, or Firm*—Holland & Knight LLP; Brian J Colandreo, Esq.; Mark H. Whittenberger, Esq.

(57) ABSTRACT

A superconducting transformer system is configured to be included within a utility power grid having a known fault current level. The superconducting transformer system includes a non-superconducting transformer interconnected between a first node and a second node of the utility power grid. A superconducting transformer is interconnected between the first node and the second node of the utility power grid. The superconducting transformer and the non-superconducting transformer are electrically connected in parallel. The superconducting transformer has a lower series impedance than the non-superconducting transformer when the superconducting transformer is operated below a critical current level and a critical temperature. The superconducting transformer is configured to have a series impedance that is at least N times the series impedance of the non-superconducting transformer when the superconducting transformer is operated at or above one or more of the critical current level and the critical temperature. N is greater than 1 and is selected to attenuate, in conjunction with an impedance of the non-superconducting transformer, the known fault current level by at least 10%.

20 Claims, 12 Drawing Sheets

U.S. PATENT DOCUMENTS

| | | | |
|---|---|---|---|
| 2003/0059652 A1 | 3/2003 | Wang et al. | |
| 2004/0266628 A1 | 12/2004 | Lee et al. | |
| 2005/0007227 A1* | 1/2005 | Lee et al. | 335/216 |
| 2006/0049027 A1* | 3/2006 | Iversen | 200/61.8 |
| 2006/0073979 A1 | 4/2006 | Thieme et al. | |
| 2007/0179063 A1* | 8/2007 | Malozemoff et al. | 505/329 |

FOREIGN PATENT DOCUMENTS

| | | | |
|---|---|---|---|
| EP | 1376709 | A1 | 2/2004 |
| JP | 08088132 | A | 4/1996 |
| JP | 2005150469 | A * | 6/2005 |
| WO | 9403955 | A1 | 2/1994 |
| WO | 9929006 | A1 | 6/1999 |
| WO | 03047006 | A2 | 6/2003 |
| WO | 2004004090 | A1 | 1/2004 |
| WO | 2007015924 | A1 | 2/2007 |

OTHER PUBLICATIONS

Ise et al. "Characteristics of a 40K VA three phase superconducting transformer and its parallel operation with a conventional transformer". Jun. 1995.*

Resistivity of Steel. Ugur. Dec. 2006.*

Resistivity of Copper. Ritter, Bridget. Dec. 2004.*

Verhaege, et al., "HTS materials for ac current transport and fault current limitation", IEEE Transactions on Applied Superconductivity article, Mar. 2001, vol. 11, No. 1, pp. 2503-2506. (4 pages).

Paasi, et al., "Design Performance of a Superconducting Power Link", IEEE Transactions on Applied Superconductivity article, Mar. 2001, vol. 11, No. 1, pp. 1928-1931. (4 pages).

Kraemer, et al., "Switching Behavior of YBCO Thin Film Conductors in Resistive Fault Current Limiters", German Federal Ministry for Education, Science and Technology article, Aug. 2005 (4 pages).

Serres, et al., "Current Limitation in High Temperature Superconducting Transformers and Impact on the Grid", Cigre Session article, 2000 12-205 (6 pages).

Maguire, et al., "Development and Demonstration of a Long Length HTS Cable to Operate in the Long Island Power Authority Transmission Grid", Session 1LT01 HTS Power Cables-III, pp. 1-7, Manuscript received Oct. 5, 2004 (7 pages).

Noe, et al., "High-temperature superconductor fault current limiters: concepts, applications, and development status", Superconductor Science and Technology 20, 2007, R15-R29 (15 pages).

Usoskin, et al., "Superoli Fault-Current Limiters Based on YBCO-Coated Stainless Steel Tapes", IEEE Transactions on Applied Superconductivity, vol. 13, No. 2, Jun. 2003, pp. 1972-1975 (4 pages).

Funaki, K., et al. "Development of a 500 kVA-class Oxide-Superconducting Power Transformer Operated at Liquid-Nitrogen Temperature," Cryogenics, Feb. 1, 1998, pp. 211-220, vol. 38, No. 2.

Zueger, H., "630 kVA High Temperature Superconducting Transformer," Cryogenics, Nov. 1, 1998, pp. 1169-1172, vol. 38, No. 11.

Sykulski, J.K., et al., "Prospects for Large High-Temperature Superconducting Power Transformers: Conclusions From a Design Study," IEE Proceedings: Electric Power Applications, Institution of Electrical Engineers, GB, dated Jan. 11, 1999, pp. 41-52, vol. 146, No. 1.

Reis, Chandra, et al., "Development of High Temperature Superconducting Power Transformers," IEEE Power Engineering Society Winter Meeting, Jan. 28, 2001, pp. 432-437.

International Search Report and Written Opinion, dated Jun. 9, 2008, received in international patent application No. PCT/US2008/052307, 14 pgs.

International Search Report and Written Opinion, dated Jun. 10, 2008, received in international patent application No. PCT/US2008/052290, 12 pgs.

Annex to Form PCT/ISA/206, Communication Relating to the Results of the Partial International Search, dated Jun. 12, 2008, received in international patent application No. PCT/US2008/052302, 2 pgs.

Noe, et al., "Supraleitende Strombegrenzer in Der Energietechnik," Elektrie, Jan. 1, 2007, pp. 414-424, V. 51, No. 11/12, Veb Verlag Technik, Berlin.

Norris, W.T., et al, "Fault Current Limiters Using Superconductors," Cryogenics, Oct. 1, 1997, pp. 657-665, V. 37, No. 10, Elsevier Science Ltd., Great Britain.

International Search Report with Written Opinion, dated Sep. 17, 2008, received in international patent application No. PCT/US2008/052302, 15 pgs.

International Search Report with Written Opinion, dated Sep. 19, 2008, received in international patent application No. PCT/US2008/0052293, 14 pgs.

Norris, W.T., et al, "Fault Current Limiters Using Superconductors," Cryogenics, Oct. 1, 1997, pp. 657-665, V.37, No. 10, Elsevier Science Ltd., Great Britain.

International Preliminary Report on Patentability with Written Opinion, dated Aug. 20, 2009, received in international patent application No. PCT/US08/052290, 8 pgs.

International Preliminary Report on Patentability with Written Opinion, dated Aug. 20, 2009, received in international patent application No. PCT/US08/052293, 8 pgs.

International Preliminary Report on Patentability with Written Opinion, dated Aug. 20, 2009, received in international patent application no. PCT/US08/052302, 9 pgs.

* cited by examiner

PARALLEL HTS TRANSFORMER DEVICE

RELATED APPLICATION(S)

This application is a continuation-in-part of and claims priority to U.S. patent application Ser. No. 11/673,281, filed Feb. 9, 2007, and entitled "Parallel Connected HTS Utility Device and Method of Using Same", which is herein incorporated by reference.

This application claims priority to U.S. patent application Ser. No. 11/688,802, filed Mar. 20, 2007, and entitled "Parallel Connected HTS FCL Device", which is herein incorporated by reference.

This application claims priority to U.S. patent application Ser. No. 11/688,809, filed Mar. 20, 2007, and entitled "Fault Current Limiting HTS Cable and Method of Configuring Same", which is herein incorporated by reference.

This application claims priority to U.S. patent application Ser. No. 11/688,817, filed Mar. 20, 2007, and entitled "HTS Wire", which is herein incorporated by reference.

TECHNICAL FIELD

This disclosure relates to HTS devices and, more particularly, to HTS devices configured to operate as fault current limiting devices.

BACKGROUND

As worldwide electric power demands continue to increase significantly, utilities have struggled to meet these increasing demands both from a power generation standpoint as well as from a power delivery standpoint. Delivery of power to users via transmission and distribution networks remains a significant challenge to utilities due to the limited capacity of the existing installed transmission and distribution infrastructure, as well as the limited space available to add additional conventional transmission and distribution lines and cables. This is particularly pertinent in congested urban and metropolitan areas, where there is very limited existing space available to expand capacity.

Flexible, long-length power cables using high temperature superconductor (HTS) wire are being developed to increase the power capacity in utility power transmission and distribution networks, while maintaining a relatively small footprint for easier installation and using environmentally clean liquid nitrogen for cooling. For this disclosure, HTS is defined as a superconductor with a critical temperature at or above 30 K, which includes materials such as yttrium- or rare-earth-barium-copper-oxide (i.e., YBCO); thallium-barium-calcium-copper-oxide; bismuth-strontium-calcium-copper-oxide (henceforth referred to as BSCCO); mercury-barium-calcium-copper-oxide; and magnesium diboride ($MgB_2$). YBCO has a critical temperature approximately 90 K. BSCCO has a critical temperature of approximately 90 K in one composition and approximately 110 K in a second composition. $MgB_2$ has a critical temperature of up to approximately 40 K. These composition families are understood to include possible substitutions, additions and impurities, as long as these substitutions, additions and impurities do not reduce the critical temperature below 30° K. Such HTS cables allow for increased amounts of power to be economically and reliably provided within congested areas of a utility power network, thus relieving congestion and allowing utilities to address their problems of transmission and distribution capacity.

An HTS power cable uses HTS wire as the primary conductor of the cable (i.e., instead of traditional copper conductors) for the transmission and distribution of electricity. The design of HTS cables results in significantly lower series impedance, when compared to conventional overhead lines and underground cables. Here the series impedance of a cable or line refers to the combination of resistive impedance of the conductors carrying the power, and the reactive impedance associated with the cable architecture or overhead line. For the same cross-sectional area of the cable, HTS wire enables a three to five times increase in current-carrying capacity when compared to conventional alternating current (AC) cables; and up to a ten times increase in current-carrying capacity when compared to conventional direct current (DC) cables.

An HTS transformer may use HTS wire as the primary conductor in the transformer (i.e., instead of traditional copper conductors) for the transformation of ac power from one voltage and current level to another. See *Current Limitation in High Temperature Superconducting Transformers and Impact on the Grid*, E. Serres et al., CIGRE Session 2000, 12-205. HTS transformers can be designed with significantly lower impedance in their superconducting operating state, when compared to conventional transformers. In addition to their reduced impedance, HTS transformers enable many benefits, including lower ac losses, significantly reduced footprint, elimination of oil in favor of non-flammable and environmentally non-contaminating liquid nitrogen.

In addition to capacity problems, another significant problem for utilities resulting from increasing power demand (and hence increased levels of power being generated and transferred through the transmission and distribution networks) are increased "fault currents" resulting from "faults". Faults may result from network device failures, acts of nature (e.g. lightning), acts of man (e.g. an auto accident breaking a power pole), or any other network problem causing a short circuit to ground or from one phase of the utility network to another phase. In general, such a fault appears as an extremely large load materializing instantly on the utility network. In response to the appearance of this load, the network attempts to deliver a large amount of current to the load (i.e., the fault). Any given link in the network of a power grid may be characterized by a maximum fault current that may flow, in the absence of fault current limiting measures, during the short circuit that precipitates the maximum fault condition. The fault currents may be so large in large power grids that without fault current limiting measures, most electrical equipment in the grid may be damaged or destroyed. The conventional way of protecting against fault currents is to rapidly open circuit breakers and completely stop the current and power flow.

Detector circuits associated with circuit breakers monitor the network to detect the presence of a fault (or over-current) situation. Within a few milliseconds of detection, activation signals from the detector circuits may initiate the opening of circuit breakers to prevent destruction of various network components. Currently, the maximum capability of existing circuit breaker devices is approximately 80,000 amps, and these are for transmission level voltages only. Many sections of the utility network built over the previous century were built with network devices capable of withstanding only 40,000-63,000 amps of fault current. Unfortunately, with increased levels of power generation and transmission on utility networks, fault current levels are increasing to the point where they will exceed the capabilities of presently installed or state-of-the-art circuit breaker devices (i.e. be greater than 80,000 amps) both at distribution and transmission level voltages. Even at lower fault current levels, the costs of upgrading circuit breakers from a lower level to a higher level across an entire grid can be very high. Accordingly, utilities are looking for new solutions to deal with the increasing level of fault currents. In most cases, it is desirable to reduce fault currents by at least 10% to make a meaningful improvement in the operation of a grid. One such solution in development is a device called an HTS fault current limiter (FCL).

An HTS FCL is a dedicated device interconnected to a utility network that reduces the amplitude of the fault currents to levels that conventional, readily available or already installed circuit breakers may handle. See *High-Temperature Superconductor Fault Current Limiters* by Noe and M. Steurer, Supercond. Sci. Technol. 20 (2007) R15-R29. Such HTS FCLs have typically been configured out of short rigid modules made of solid bars or cylinders of HTS material that have very high resistance when they are driven over their superconducting critical current into a resistive state. Unfortunately, such standalone HTS FCLs are currently quite large and expensive. Space is particularly at a premium in substations in dense urban environments where HTS cables are most needed. Utilities may also use large inductors, but they may cause extra losses, voltage regulation and grid stability problems. And, unfortunately, pyrotechnic current limiters (e.g., fuses) need replacement after every fault event. Further, while new power electronic FCLs are under development, there are questions about whether they can be fail-safe and whether they can be extended reliably to transmission voltage levels.

To allow HTS cables to survive the flow of fault currents, a significant amount of copper may be introduced in conjunction with the HTS wire, but this adds to the weight and size of the cable. See *Development and Demonstration of a Long Length HTS Cable to Operate in the Long Island Power Authority Transmission Grid* by J. F. Maguire, F. Schmidt, S. Bratt, T. E. Welsh, J. Yuan, A. Allais, and F. Hamber, to be published in IEEE Transaction on Applied Superconductivity.

Often, copper fills the central former in the core of the HTS cable around which the HTS wire is helically wound, and this prevents the core from being used as a passage for the flow of liquid nitrogen. Alternatively and especially for multi-phase cables, copper wires may be mixed in with the HTS wires within the helically wound layers of the cable. These copper wires or structures may be electrically in parallel with the HTS wires and may be called "copper shunts" within the HTS cable. In the presence of a large fault current that exceeds the critical current of the HTS wires of the cable, they quench or switch to a resistive state that can heat from resistive $I^2R$ losses (where I is the current and R is the resistance of the cable). The "copper shunts" may be designed to absorb and carry the fault current to prevent the HTS wires from overheating. The amount of copper utilized may be large enough so that the total resistance of the copper in the cable is comparatively small and has a negligible effect in reducing the level of the fault current. Copper may be defined to mean pure copper or copper with a small amount of impurities such that its resistivity is comparatively low in the 77-90 K temperature range (e.g., <0.5 microOhm-cm, or as low as 0.2 microOhm-cm.

In the European SUPERPOLI program (See *SUPERPOLI Fault-Current Limiters Based on YBCO-Coated Stainless Steel Tapes* by A. Usoskin et al., IEEE Trans. on Applied Superconductivity, Vol. 13, No. 2, June 2003, pp. 1972-5; *Design Performance of a Superconducting Power Link* by Paasi et al., IEEE Trans. on Applied Superconductivity, Vol. 11, No. 1, March 2001, pp. 1928-31; *HTS Materials of AC Current Transport and Fault Current Limitation* by Verhaege et al., IEEE Trans. on Applied Superconductivity, Vol. 11, No. 1, March 2001, pp. 2503-6; and U.S. Pat. No. 5,859,386, entitled "Superconductive Electrical Transmission Line"), superconducting power links were investigated that may also limit current.

Following the typical approach for earlier standalone FCLs, this program investigated rigid solid rods or cylinders of HTS material that formed modules or busbars for the power link. A typical length of a module or busbar was 50 cm to 2 meters. In a second approach, coated conductor wire was used in which YBCO material was coated on high resistance stainless steel substrates. A gold stabilizer layer was used, but it was kept very thin to keep the resistance per length as high as possible. The wire was helically wound on a rigid cylindrical core that formed another option for a module or busbar for the power link. In response to a fault current, both these modules switch to a very highly resistive state to limit the current. The concept proposed in the SUPERPOLI program to create a longer length cable was to interconnect the rigid modules with flexible braided copper interconnections. See U.S. Pat. No. 5,859,386, entitled "Superconductive Electrical Transmission Line". The possibility of designing and fabricating a long-length continuously flexible cable with fault-current-limiting functionality using lower resistance and higher heat capacity wires, and hence a lower level of local heating, was not considered. Nor was the possibility of additional grid elements that could optimize the functionality of the link.

It is desirable to improve the manner in which an electric grid can handle fault currents and to provide an improved alternative to the use of standalone FCLs or other fault current limiting devices e.g., high resistance-per-length fault-current limiting busbars. HTS transformers that incorporate a current limiting functionality offer a cost-effective way to do this by avoiding the necessity for separate and costly fault-current-limiting devices in crowded utility substations. Such current limiting transformers may have improved functionality if they are configured in a grid in an optimal way to be described in this disclosure. A practical long-length flexible HTS power cable that incorporates fault current limiting functionality would also provide major benefits in establishing high capacity, low footprint and environmentally clean power transmission and distribution, while at the same time avoiding the necessity for separate and costly fault-current-limiting devices in crowded utility substations.

SUMMARY OF DISCLOSURE

In a first implementation of this disclosure, a superconducting transformer system is configured to be included within a utility power grid having a known fault current level. The superconducting transformer system includes a non-superconducting transformer interconnected between a first node and a second node of the utility power grid. A superconducting transformer is interconnected between the first node and the second node of the utility power grid. The superconducting transformer and the non-superconducting transformer are electrically connected in parallel. The superconducting transformer has a lower series impedance than the non-superconducting transformer when the superconducting transformer is operated below a critical current level and a critical temperature. The superconducting transformer is configured to have a series impedance that is at least N times the series impedance of the non-superconducting transformer when the superconducting transformer is operated at or above one or more of the critical current level and the critical temperature. N is greater than 1 and is selected to attenuate, in conjunction with an impedance of the non-superconducting transformer, the known fault current level by at least 10%.

One or more of the following features may be included. The non-superconducting transformer may be maintained at a non-cryogenic temperature. The non-cryogenic temperature is at least 273 K. An impedance adjustment device may be coupled in series with the non-superconducting transformer and may be configured to limit the fault current level to a desired value. The impedance adjustment device may include a reactor assembly. A fast switch assembly may be coupled in series with the superconducting transformer.

N may be greater than or equal to 3. N may be greater than or equal to 5. At least one non-superconducting electrical cable may be coupled in series with the non-superconducting transformer. At least one superconducting electrical cable may be coupled in series with the superconducting transformer. The superconducting transformer may include one or more HTS wires. At least one of the one or more HTS wires may be constructed of a material chosen from the group consisting of: yttrium- or rare-earth-barium-copper-oxide; thallium-barium-calcium-copper-oxide; bismuth-strontium-calcium-copper-oxide; mercury-barium-calcium-copper-oxide; and magnesium diboride. At least one of the one or more HTS wires may include one or more stabilizer layers having a total thickness within a range of 200-500 microns and a resistivity larger than 30 microOhm-cm at 90 K.

The stabilizer layer may be constructed, at least in part, of a material chosen from the group consisting of stainless steel, Hastelloy™ and Inconel™. At least one of the one or more HTS wires may include a high heat capacity insulating encapsulant. The high heat capacity insulating encapsulant may include a polymer material. At least one of the one or more HTS wires may be configured to operate in a superconducting mode below a critical current level. At least one of the one or more HTS wires may be configured to operate in a non-superconducting mode at or above the critical current level.

In another implementation of this disclosure, a superconducting transformer system is configured to be included within a utility power grid having a known fault current level. The superconducting transformer system includes a non-cryogenic, non-superconducting transformer interconnected between a first node and a second node of the utility power grid. A superconducting transformer is interconnected between the first node and the second node of the utility power grid. The superconducting transformer and the non-superconducting transformer are electrically connected in parallel. The superconducting transformer has a lower series impedance than the non-superconducting transformer when the superconducting transformer is operated below a critical current level and a critical temperature. The superconducting transformer is configured to have a series impedance that is at least N times the series impedance of the non-superconducting transformer when the superconducting transformer is operated at or above one or more of the critical current level and the critical temperature. N is greater than 1.

One or more of the following features may be included. The superconducting transformer may include one or more HTS wires. At least one of the one or more HTS wires may be constructed of a material chosen from the group consisting of: yttrium- or rare-earth-barium-copper-oxide; thallium-barium-calcium-copper-oxide; bismuth-strontium-calcium-copper-oxide; mercury-barium-calcium-copper-oxide; and magnesium diboride. At least one of the one or more HTS wires may include one or more stabilizer layers having a total thickness within a range of 200-500 microns and a resistivity larger than 30 microOhm-cm at 90 K.

The details of one or more implementations are set forth in the accompanying drawings and the description below. Other features and advantages will become apparent from the description, the drawings, and the claims.

BRIEF DESCRIPTION OF THE DRAWINGS

Like reference symbols in the various drawings indicate like elements.

DETAILED DESCRIPTION OF EXEMPLARY EMBODIMENTS

Overview

Figure 1:
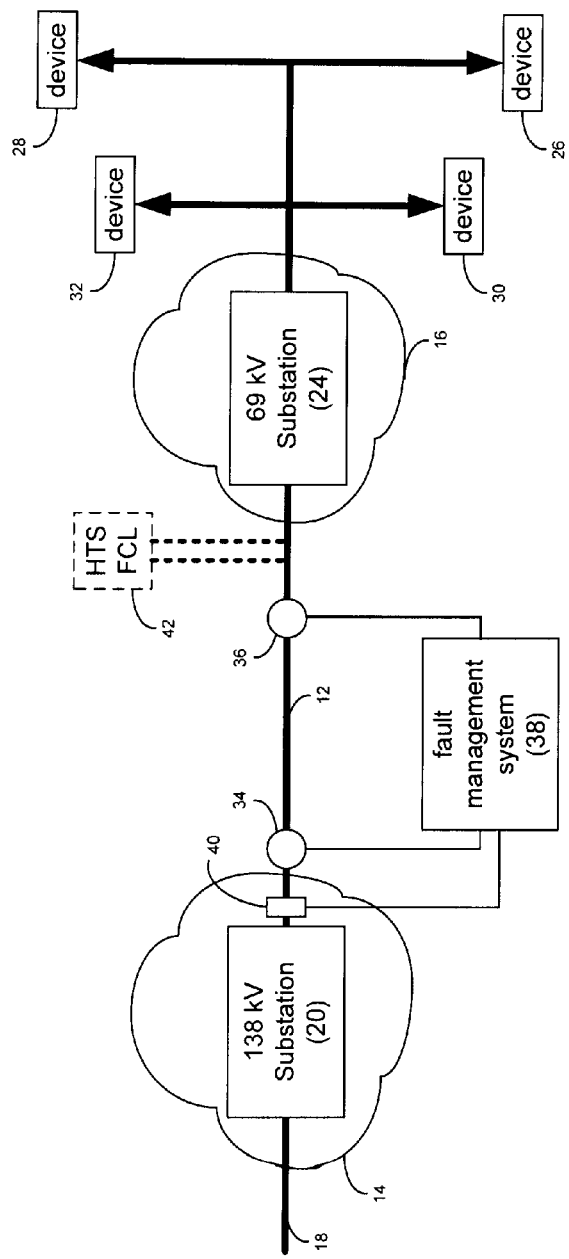
FIG. 1 is a schematic diagram of a copper-cored HTS cable installed within a utility power grid.

Referring to FIG. 1, a portion of a utility power grid 10 may include a high temperature superconductor (HTS) cable 12. HTS cable 12 may be hundreds or thousands of meters in length and may provide a relatively high current/low resistance electrical path for the delivery of electrical power from generation stations (not shown) or imported from remote utilities (not shown).

The cross-sectional area of HTS cable 12 may be only a fraction of the cross-sectional area of a conventional copper core cable and may be capable of carrying the same amount of electrical current. As discussed above, within the same cross-sectional area, an HTS cable may provide three to five times the current-carrying capacity of a conventional AC cable; and up to ten times the current-carrying capacity of a conventional DC cable. As HTS technology matures, these ratios may increase.

As will be discussed below in greater detail, HTS cable 12 may include HTS wire, which may be capable of handling as much as one-hundred-fifty times the electrical current of similarly-sized copper wire. Accordingly, by using a relatively small quantity of HTS wire (as opposed to a large quantity of copper conductors stranded within the core of a conventional AC cable), an HTS power cable may be constructed that is capable of providing three to five times as much electrical power as an equivalently-sized conventional copper-conductor power cable.

HTS cable 12 may be connected within a transmission grid segment 14 that carries voltages at a level of e.g., 138 kV and extends from grid segment 14 to grid segment 16, which receives this voltage and transforms it to a lower level of e.g., 69 kV. For example, transmission grid segment 14 may receive power at 765 kV (via overhead line or cable 18) and may include a 138 kV substation 20. 138 kV substation 20 may include a 765 kV/138 kV transformer (not shown) for stepping down the 765 kV power received on cable 18 to 138 kV This "stepped-down" 138 kV power may then be provided via e.g., HTS cable 12 to transmission grid segment 16. Transmission grid segment 16 may include 69 kV substation 24, which may include a 138 kV/69 kV transformer (not shown) for stepping down the 138 kV power received via HTS cable 12 to 69 kV power, which may be distributed to e.g., devices 26, 28, 30, 32. Examples of devices 26, 28, 30, 32 may include, but are not limited to 34.5 kV substations.

The voltage levels discussed above are for illustrative purposes only and are not intended to be a limitation of this disclosure. Accordingly, this disclosure is equally applicable to various voltage and current levels in both transmission and distribution systems. Likewise, this disclosure is equally applicable to non-utility applications such as industrial power distribution or vehicle power distribution (e.g. ships, trains, aircraft, and spacecraft).

One or more circuit breakers 34, 36 may be connected on e.g., each end of HTS cable 12 and may allow HTS cable 12 to be quickly disconnected from utility power grid 10. Fault management system 38 may provide over-current protection for HTS cable 12 to ensure that HTS cable 12 is maintained at a temperature that is below the point at which HTS cable 12 may be damaged.

Fault management system 38 may provide such over-current protection by monitoring the current flowing in the segment of the utility grid to which HTS cable 12 is coupled. For example, fault management system 38 may sense the current passing through 138 kV substation 20 (using e.g., current sensor 40) and may control the operation of breakers 34, 36 based, at least in part, on the signal provided by current sensor 40.

In this example, HTS cable 12 may be designed to withstand a fault current as high as 51 kA with a duration of 200 ms (i.e., 12 cycles of 60 Hz power). The details of fault management system 38 are described in co-pending U.S. patent application Ser. No. 11/459,167, which was filed on Jul. 21, 2006, and is entitled Fault Management of HTS Power Cable. Typically, this requires the HTS cable to contain a significant amount of copper, which helps to carry the high fault current and thus protects the HTS wires. The copper is present to protect the HTS cable, but it has no significant current limiting effect because of its very low resistance.

Figure 2:
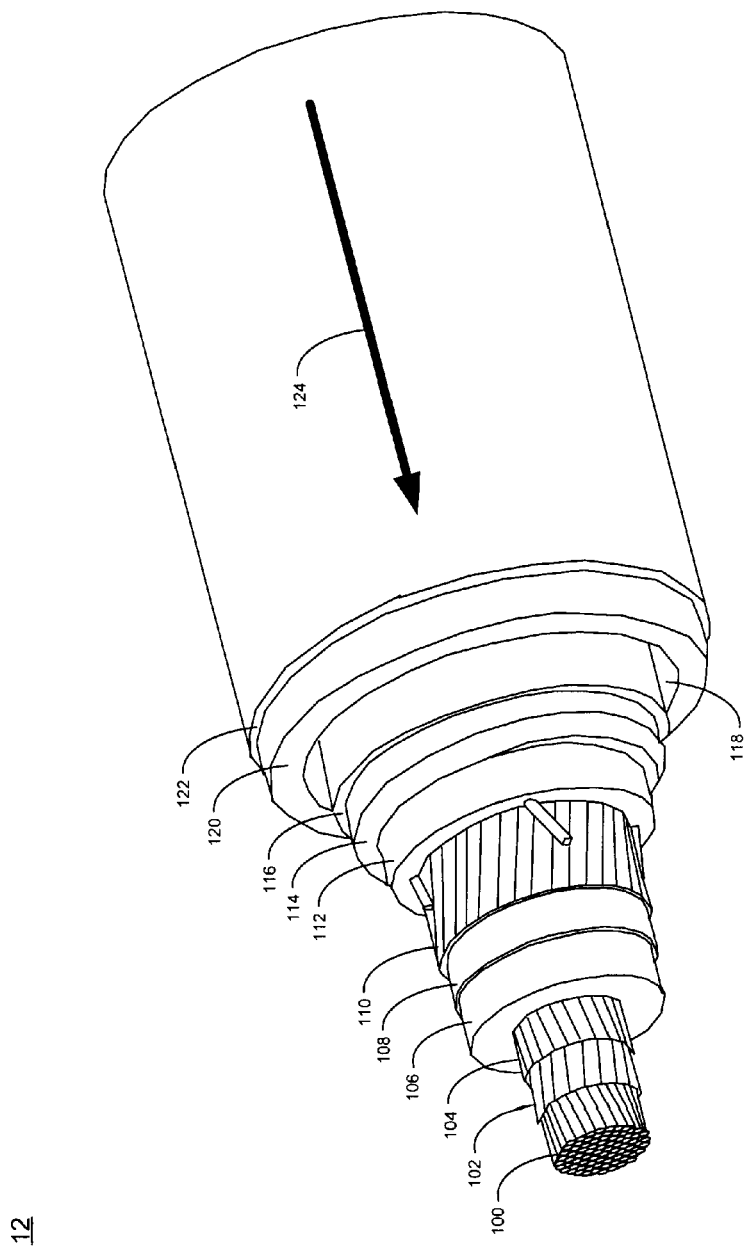
FIG. 2 is an isometric view of the copper-cored HTS cable of FIG. 1.

Referring also to FIG. 2, there is shown a typical embodiment of copper-cored HTS cable 12 that may include stranded copper core 100 surrounded in radial succession by first HTS layer 102, second HTS layer 104, high voltage dielectric insulation layer 106, copper shield layer 108, HTS shield layer 110, coolant passage 112, inner cryostat wall 114, thermal insulation 116, vacuum space 118, outer cryostat wall 120 and an outer cable sheath 122. HTS layer 102 and HTS layer 104 may also be referred to as "phase conductors". Copper shield layer 108 may alternatively be positioned on the outside of HTS shield layer 110. HTS layer 102 and HTS layer 104 may also be referred to as "phase conductors". During operation, a refrigerant (e.g., liquid nitrogen, not shown) may be supplied from an external coolant source (not shown) and may be circulated within and along the length of coolant passage 112. All components of the cable are designed so as to enable flexibility of HTS cable 12. For example, stranded copper core 100 (upon which first HTS layer 102 and second HTS layer 104 are wound) is flexible. Accordingly, by utilizing flexible stranded copper core 100, an HTS cable 12 is realized that is continuously flexible along its length. Optionally, a corrugated metal former may be used to support the helically wound HTS wires, providing continuous flexibility along the length of the cable.

Additionally/alternatively, additional coaxial HTS layers may be utilized. For example, more than two layers of HTS wires may be used for a single phase. Also three groups of HTS layers separated by insulation layers (not shown) may be utilized to carry three-phase power. An example of such a cable arrangement is the Triax HTS Cable arrangement proposed by Ultera (i.e., a joint venture of Southwire Company of Carrollton, Ga. and nkt cables of Cologne, Germany). Other embodiments of HTS cable 12 may include, but are not limited to: warm and/or cold dielectric configurations; single-phase vs. three-phase configurations; and various different shielding configurations (e.g., no shield and cryostat-based shielding).

Copper core 100 and copper shield layer 108 may be configured to carry fault currents (e.g., fault current 124) that may appear within cable 12. For example, when fault current 124 appears within cable 12, the current within HTS layers 102, 104 may dramatically increase to a level that exceeds the critical current level (i.e., $I_c$) of HTS layers 102, 104, which may cause the superconductors to lose their superconducting characteristics (i.e., HTS layers 102, 104 may go "normal"). A typical value for critical current level $I_c$ is 4242 A peak for a cable rated at 3000 $A_{rms}$, (where $A_{rms}$ refers to root-mean-square Amperes of current).

The critical current level in HTS materials may depend upon the choice of electric field level. Conventionally, critical current level $I_c$ is defined as an electric field level of 1 microvolt/cm, though lower values are also used. However, typically superconductors exhibit a transition region between the zero-resistance (i.e., superconducting) and fully-resistive (i.e., non-superconducting) states as a function of current level. Wire losses resulting from operation in this transition region are below those of the fully-resistive state. Therefore, in practice, portions of wire in HTS cable 12 may switch to the fully resistive state at a critical current level $I_c$ that is a factor ("f") times the conventional critical current level $I_c$ defined by the 1 microvolt/cm criterion. In meander line wires with YBCO thin films, this factor ("f") was determined to be 2, but it was observed to vary somewhat with time. See *Switching Behavior of YBCO Thin Film Conductors in Resistive Fault Current Limiters* by H.-P. Kraemer et al., IEEE Trans. on Applied Superconductivity, vol. 13, No. 2, June 2003, pp. 2044-7. The f-factor for HTS wires with similar YBCO thin films is anticipated to be in the same range, the range being estimated to be 1-4.

Accordingly, when the product of the critical current level (as defined above) and the f-factor is exceeded, the resistance of HTS layers 102, 104 may increase significantly and may become comparatively very high (i.e., when compared to copper core 100). As the current passing through a plurality of parallel wires is distributed inversely with respect to the resistance of the individual wires, the majority of fault current 124 may be diverted to copper core 100, which is connected in parallel with HTS layers 102, 104. This transmission of fault current 124 through copper core 100 may continue until: fault current 124 subsides; or the appropriate circuit breakers (e.g., circuit breakers 34, 36) interrupt the transmission of fault current 124 through HTS cable 12.

Overheating of the HTS wires in HTS cable 12 may be avoided by two benefits provided by the copper core 100. First, by redirecting fault current 124 (or at least a portion thereof) from HTS layers 102, 104 to copper core 100, the overheating of the HTS conductors in HTS cable 12 may be avoided. And second, the added heat capacity of copper core 100 reduces the temperature rise in HTS layers 102 and 104. In the event that fault current 124 (or at least a portion thereof) was not redirected from HTS layers 102, 104 to copper core 100, fault current 124 may heat the HTS wires in HTS cable 12 significantly due to the high resistance of HTS layers 102, 104, which may result in the formation of gaseous "bubbles" of liquid nitrogen (i.e., due to liquid nitrogen being converted from a liquid state to a gaseous state within coolant passage 112). Unfortunately, the formation of gaseous "bubbles" of liquid nitrogen may reduce the dielectric strength of the dielectric layer and may result in voltage breakdown and the destruction of HTS cable 12. For warm dielectric cable configurations (not shown), fault current not redirected away from HTS layers 102, 104 may simply overheat and destroy HTS layers 102, 104.

Examples of HTS cable 12 may include but are not limited to HTS cables available from Nexans of Paris France; Sumitomo Electric Industries, Ltd., of Osaka, Japan; and Ultera (i.e., a joint venture of Southwire Company of Carrollton, Ga. and nkt cables of Cologne, Germany).

While copper core 100 redirects fault currents (or portions thereof) around HTS layers 102, 104, there are disadvantages to utilizing such an "internal" copper core. For example, copper core 100 may require HTS cable 12 to be physically larger and heavier, which may result in increased cost and greater heat retention within HTS cable 12. Accordingly, more refrigeration may be required to compensate for the additional heat retention, resulting in higher overall system and operating costs. Moreover, the increased heat capacity of copper core 100 and the thermal resistance between HTS layers 102, 104 and the coolant due to the dielectric layer may greatly increase recovery times should the energy of a fault current increase the temperature beyond the point where superconductivity can be maintained in HTS layers 102, 104. For example, in the event that a fault current is redirected through copper core 100, it may take several hours for the refrigeration system (not shown) to cool down HTS cable 12 to within the appropriate operating temperature range (e.g., 65-77 K). The time required to cool down HTS cable 12 to within the operating range of the cable is commonly referred to as the "recovery time", which may be required by utilities to be a few seconds (or less) for transmission devices or a few tenths of a second (or less) for distribution devices. Alternatively, a standalone fault current limiter may be used with HTS cable 12 to limit fault currents; however this has the disadvantage of requiring another large and costly piece of electrical equipment to be installed in the substation linked to HTS cable 12.

Figure 3:
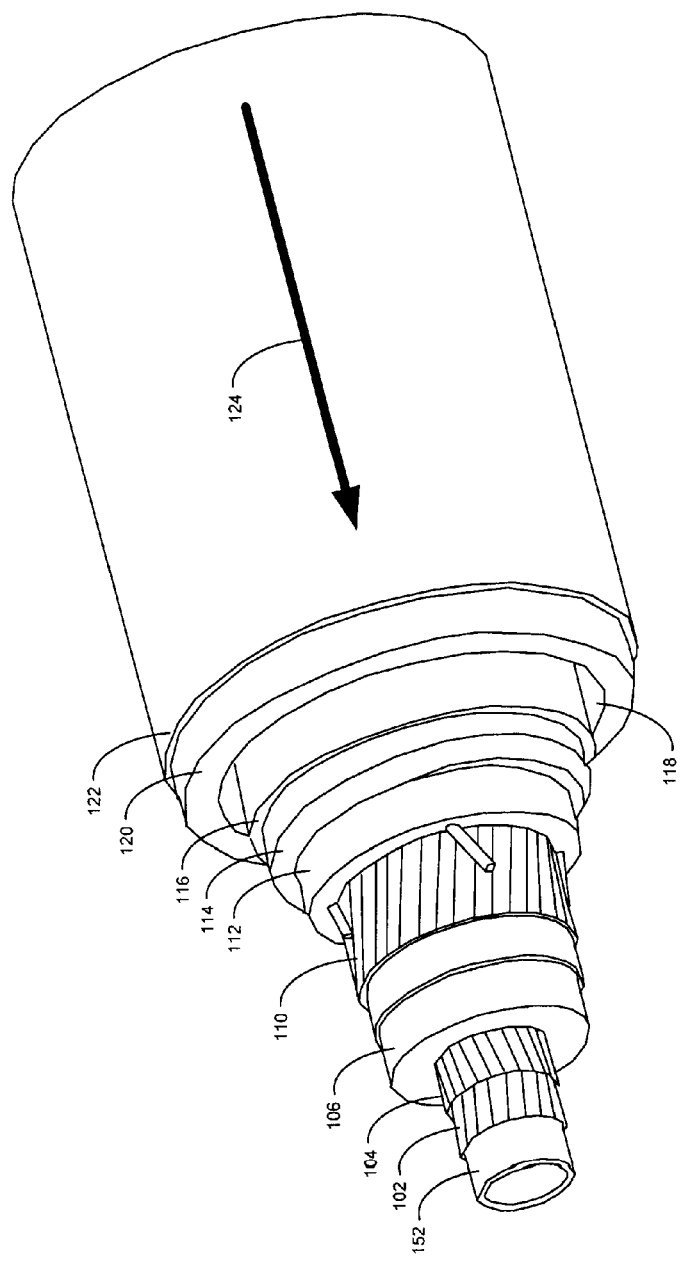
FIG. 3 is an isometric view of a hollow-core HTS cable.

Referring to FIG. 3, there is shown a flexible, hollow-core HTS cable 150, according to this disclosure. While HTS cable 150 may include various components of prior art copper-cored HTS cable 12, HTS cable 150 does not include stranded copper core 100 (FIG. 2), which was replaced with a flexible hollow core (e.g., inner coolant passage 152). An example of inner coolant passage 152 may include, but is not limited to, a flexible, corrugated stainless steel tube. All copper shield layers are removed as well. A refrigerant (e.g., liquid nitrogen) may flow through inner coolant passage 152.

In a fashion similar to that of copper-cored HTS cable 12, inner coolant passage 152 may be surrounded in radial succession by first HTS layer 102, second HTS layer 104 (usually helically wound with the opposite helicity of layer 102), high voltage dielectric insulation layers 106, support structure 108, HTS shield layer 110, coolant passage 112, inner cryostat wall 114, thermal insulation 116, vacuum space 118, outer cryostat wall 120 and an outer cable sheath 122. During operation, a refrigerant (e.g., liquid nitrogen, not shown) may be supplied from an external coolant source (not shown) and may be circulated within and along the length of coolant passage 114 and inner coolant passage 152. An alternative coolant (e.g., liquid neon or liquid hydrogen) may be used in the case of lower transition temperature materials like $MgB_2$.

Figure 4:
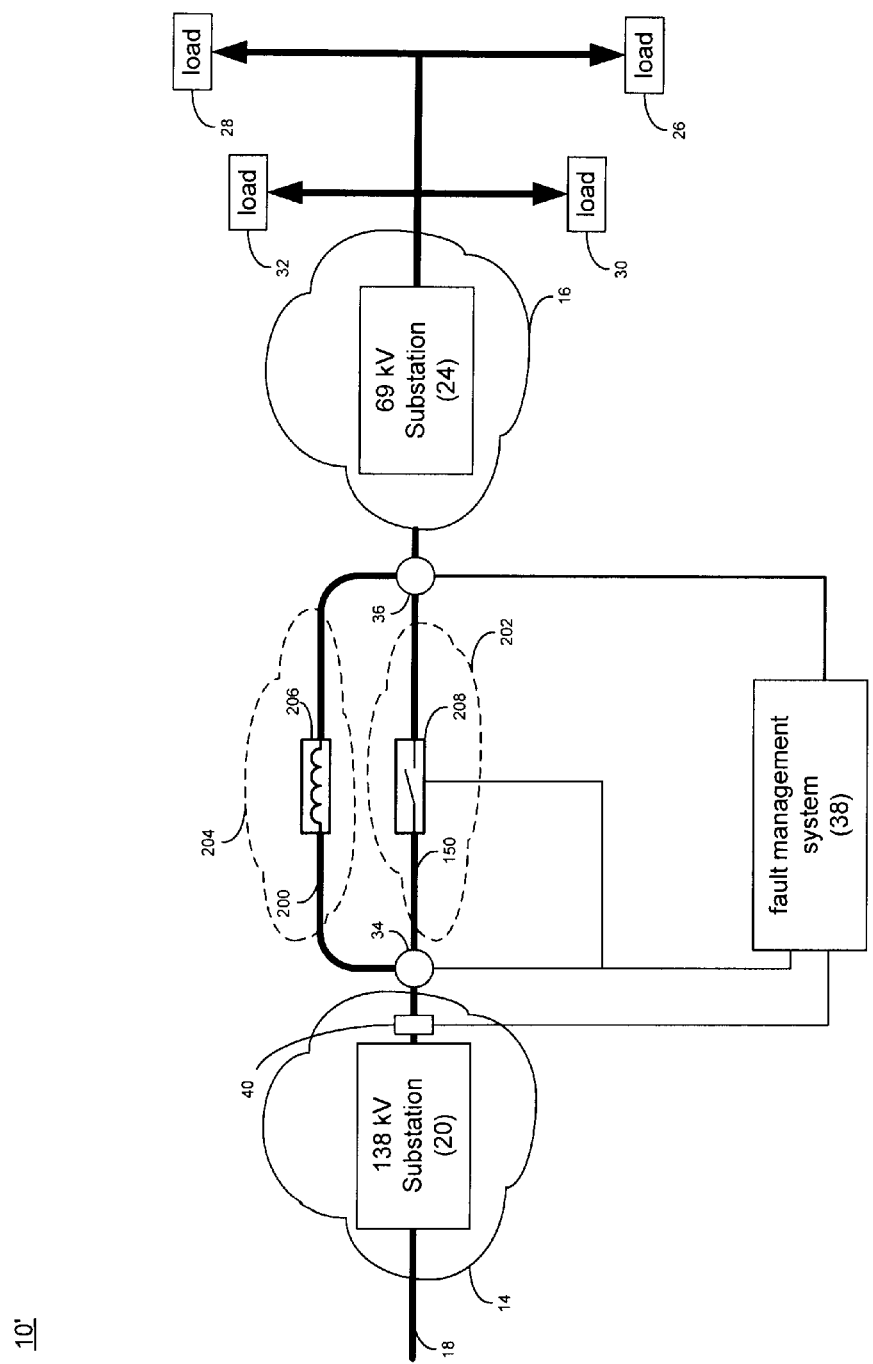
FIG. 4 is a schematic diagram of the hollow-core HTS cable of FIG. 3 installed within a utility power grid.

Referring also to FIG. 4, utility power grid portion 10' may include a conventional (i.e. non-superconducting cable) 200, connected in parallel with HTS cable 150. An example of conventional cable 200 may include but is not limited to a 500 kcmil, 138 kV Shielded Triple Permashield (TPS) power cable available from The Kerite Company of Seymour, Conn. Conventional cable 200 may be an existing cable in a retrofit application where HTS cable 150 is being added to replace one or more conventional cables to e.g., increase the power capacity of an electrical grid. Alternatively, conventional cable 200 may be a new conventional cable that is installed concurrently with HTS cable 150 and interconnected with appropriate bus work and circuit breakers.

As with HTS cable 12, all components of HTS cable 150 are designed so as to enable flexibility continuously along the length of the cable. For example and as discussed above, inner coolant passage 152 (upon which first HTS layer 102 and second HTS layer 104 are wound) is flexible. Accordingly, by utilizing flexible inner coolant passage 152, a flexible HTS cable 150 is realized.

HTS cable 150 and/or additional HTS cables (not shown) may be included within superconducting electrical path 202, which may include a portion of a power utility grid. Further, superconducting electrical path 202 may include other superconducting power distribution devices, such as buses (not shown), transformers (not shown), fault current limiters (not shown), and substations (not shown). Non-superconducting electrical path 204 may be maintained at a non-cryogenic temperature (e.g., a temperature of at least 273 K, which corresponds to 0° C.). For example, non-superconducting electrical path 204 may not be cooled and, therefore, may assume ambient temperature.

A fast switch assembly 208 may be coupled in series with HTS cable 150. An example of fast switch assembly 208 is a 138 kV Type PM Power Circuit Breaker manufactured by ABB Inc. of Greensburg, Pa. Fast switch assembly 208 (e.g., a switch capable of opening in 4 cycles) may be controllable by fault management system 38. For example, upon sensing fault current 124 (FIG. 3), fault management system 38 may open fast switch assembly 208, resulting in HTS cable 150 being essentially isolated from fault current 124. For multiphase power, a plurality of fast switch assemblies 208 may be utilized. Alternatively, some fast switch assemblies or circuit breakers are built as a single three-phase device. Fast switch assembly 208 may be reclosed after a time sufficient to allow HTS cable 150 to recover to its superconducting state. If existing utility circuit breakers 34, 36 switch quickly enough to meet the heating requirements discussed below, fast switch assembly 208 may not be required.

By removing copper core 100 (FIG. 2) and copper shield layer 108 (FIG. 2) from the inside of HTS cable 150 and utilizing an external (i.e., with respect to HTS cable 150) parallel-connected conventional cable 200 to carry e.g., fault current 124, HTS cable 150 may be physically smaller, which may result in decreased fabrication cost and lower heat loss from HTS cable 150. Accordingly, HTS cable 150 may require less refrigeration (when compared to HTS cable 12, which has greater heat retention) and may result in lower overall system and operating costs. Further, by moving copper core 100 from the inside of HTS cable 12 to the outside of HTS cable 150 (in the form of conventional cable 200), the heat capacity of HTS cable 150 and the thermal resistance between HTS layers 102, 104 and the coolant are both reduced, thus allowing for quicker recovery times in the event that fault current 124 increase the temperature of HTS cable 150 beyond the point where superconductivity may be maintained in HTS layers 102, 104. By removing copper core 100 from the inside of the HTS cable 12 and by using an appropriately-optimized HTS wire, one can incorporate fault current limiting functionality directly into HTS cable 150, thus removing the need for a separate standalone fault current limiter if one wants to protect the HTS cable or downstream utility equipment from fault currents.

HTS Cable and Fault Current Limiters

Referring again to FIG. 1, if a fault current within grid portion 10 causes the current flowing through HTS cable 12 to rise beyond the limits of conventional circuit breakers 34, 36, an HTS FCL device 42 (shown in phantom) or conventional reactor technology (not shown) may be incorporated within grid section 10 to limit the amplitude of the fault current flowing through HTS cable 12 to a level that conventional circuit breakers 34, 36 may interrupt. Under normal conditions, when nominal current levels are flowing in grid section 10, HTS FCL device 42, which is connected in series with the power flow, may be designed to introduce very low impedance into the grid (compared to other grid impedances). However, when a fault current appears in grid section 10, the current causes the superconductor in HTS FCL 42 to instantaneously go "normal" or non-superconducting (i.e., resistive), and this adds a very large impedance into grid section 10. HTS FCL 42 may be designed to limit the fault current to a predetermined level that is within the interrupting capability of conventional circuit breakers 34, 36.

Standalone HTS FCL devices 42 are being developed by various companies, including American Superconductor Corporation (of Westborough, Mass.) in conjunction with Siemens AG (of Germany). Unfortunately, adding HTS FCL device 42 to grid section 10 may be very costly and may require a significant amount of space to accommodate device 42, which may be difficult to accommodate (especially in urban areas).

According to the present disclosure, an HTS device e.g. continuously flexible, long-length HTS cable 150 (FIG. 3), when properly designed, may be used as a fault current limiter itself without the need to incorporate a separate HTS FCL, such as HTS FCL device 42 (FIG. 1). By controlling e.g., the normal-state (resistive) impedance of HTS cable 150, the HTS cable itself may be utilized to obtain the desirable effects (e.g., attenuation of fault currents) of a typical standalone HTS FCL device (e.g., HTS FCL 42) while avoiding the undesirable effects (e.g., cost and size) of the typical standalone HTS FCL device. Specifically and as will be discussed below in greater detail, if the length of HTS cable 150 is sufficiently long and if HTS cable 150 is manufactured to exhibit desired impedance characteristics, continuously flexible, long-length HTS cable 150 alone may provide significant attenuation of fault current 124 (FIG. 3) without heating to the point to create gas bubbles in the liquid cryogen and risking dielectric breakdown. In order to achieve further fault current limiting effects, the HTS cable may be placed in parallel with a conventional (i.e., non-superconducting) cable. For example, if superconducting cable 150, and conventional cable 200 are placed in parallel, this combination may be designed and operated to act as a fault current limiting cable system that is described in more detail below.

This disclosure may be applied to other HTS devices as well. For example, if another type of superconducting device (e.g., a superconducting transformer, not shown) is placed in parallel with a conventional transformer (not shown), this combination of devices may be designed and operated to act as a fault current limiting system. In this case, the conventional transformer may be sized at a fraction of the steady state ratings because it is only active during a fault event, when a fast switch cuts off power flow through the superconducting transformer during its recovery period. Alternatively, where fault current attenuation is not required, this arrangement may allow the superconducting transformer to be smaller because not all of the fault current will flow through the superconducting transformer, preferring instead to flow through the conventional transformer. Accordingly, by placing a conventional device in parallel with a superconducting device according to this disclosure, the amplitude of the fault current on the grid may be limited to the desired level (by properly sizing the conventional parallel device and/or the superconducting device), thereby allowing the use of readily available circuit breakers.

During normal operation of the HTS device (e.g., HTS cable 150), the impedance (i.e., both real and reactive) of the HTS device may be significantly lower than that of the conventional device (e.g., conventional cable 200). For example, the typical impedance of HTS cable 150 is essentially 0.00+j0.007 ohms per kilometer (when superconducting) and 1.46+j0.007 ohms per kilometer (when not superconducting and fully resistive), and the typical impedance of conventional cable 200 is 0.095+j0.171 ohms per kilometer. Note that HTS cable 150 has essentially zero resistance when superconducting. Accordingly, when HTS cable 150 is superconducting, the majority of the current passing through breakers 34, 36 will flow through HTS cable 150 (with very little or zero current passing through conventional cable 200). However, when not superconducting, the majority of the current will flow through conventional cable 200 (with only a small fraction flowing through HTS cable 150).

An impedance adjustment device (e.g., a transient-rated or fully-rated reactor assembly 206) may be coupled in series with conventional cable 200. An example of reactor assembly 206 may include, but is not limited to, an air-core dry-type power reactor manufactured by Trench® Limited of Scarborough, Ontario, Canada. Reactor assembly 206 may introduce a reactance (X), which is the imaginary portion of an impedance (Z), into non-superconducting electrical path 204. For an inductive reactor assembly, reactance (X) may be defined as $2\pi(f)(L)$, wherein (f) is the frequency of the signal applied to reactor assembly 206 and (L) is the inductance of reactor assembly 206. Accordingly, for a system in which the signal applied to reactor assembly 206 is essentially constant (e.g., a 60 Hz power distribution system), the reactance (X) of reactor assembly 206 may be varied by varying the inductance of reactor assembly 206.

Further, a fast switch assembly 208 may be coupled in series with HTS cable 150. An example of fast switch assembly 208 is a 138 kV Type PM Power Circuit Breaker manufactured by ABB Inc. of Greensburg, Pa. One or both of reactor assembly 206 and/or fast switch assembly 208 (e.g., a switch capable of opening in 4 cycles) may be controllable by fault management system 38. For example, upon sensing fault current 124, fault management system 38 may open fast switch assembly 208, resulting in reactor assembly 206 along the conventional cable 200 absorbing a portion of the power of fault current 124 and effectively isolating HTS cable 150 from fault current 124. The fast switch is also protected by the current limitation from the rapidly switching HTS cable. For multiphase power, a plurality of reactor assemblies 206 and/or fast switch assemblies 208 may be utilized. The fast switch may be reclosed after some minutes when the HTS cable has recovered to its superconducting state.

Figure 5:
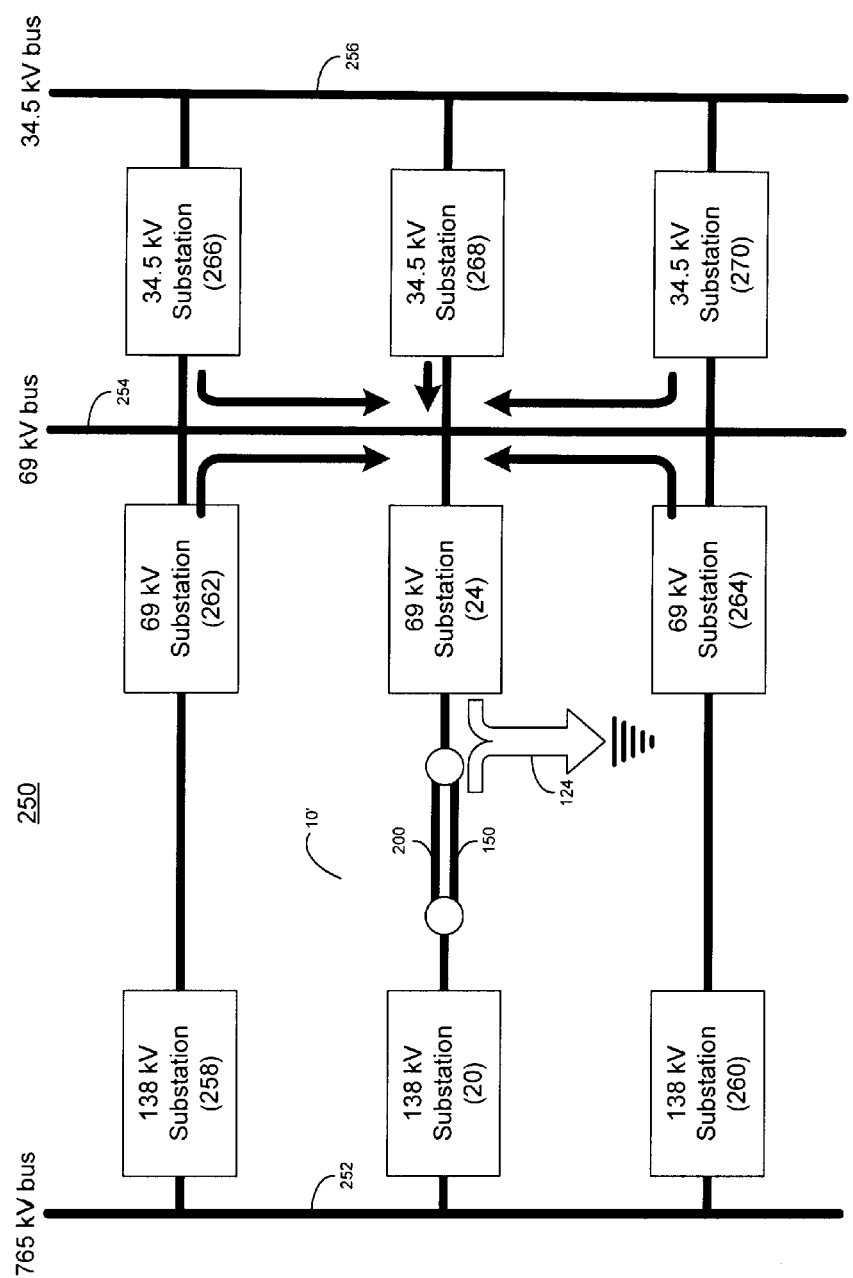
FIG. 5 is a schematic diagram of a utility power grid.

Referring also to FIG. 5, the operation of HTS cable 150 as an FCL within the context of utility power grid 250 is shown. Utility power grid 250 is shown to include 765 kV bus 252, 69 kV bus 254, and 34.5 kV bus 256. Further, utility power grid 250 is shown to include three 138 kV substations 20, 258, 260, each of which provides power to 69 kV bus 254 through three 69 kV substations 24, 262, 264. Three 34.5 kV substations 266, 268, 270 may provide power from 69 kV bus 254 to 34.5 kV bus 256. The HTS cable and FCL system, 150, 200, is shown between substations 20 and 24

When a fault current (e.g., fault current 124) is present within utility power grid 250, current may flow from all interconnected substations through all available paths to feed the fault, which may appear as a very large load placed on utility power grid 250. When calculating the fault currents realizable during a fault condition, the fault may be modeled as a short-circuit to ground.

Figure 6:
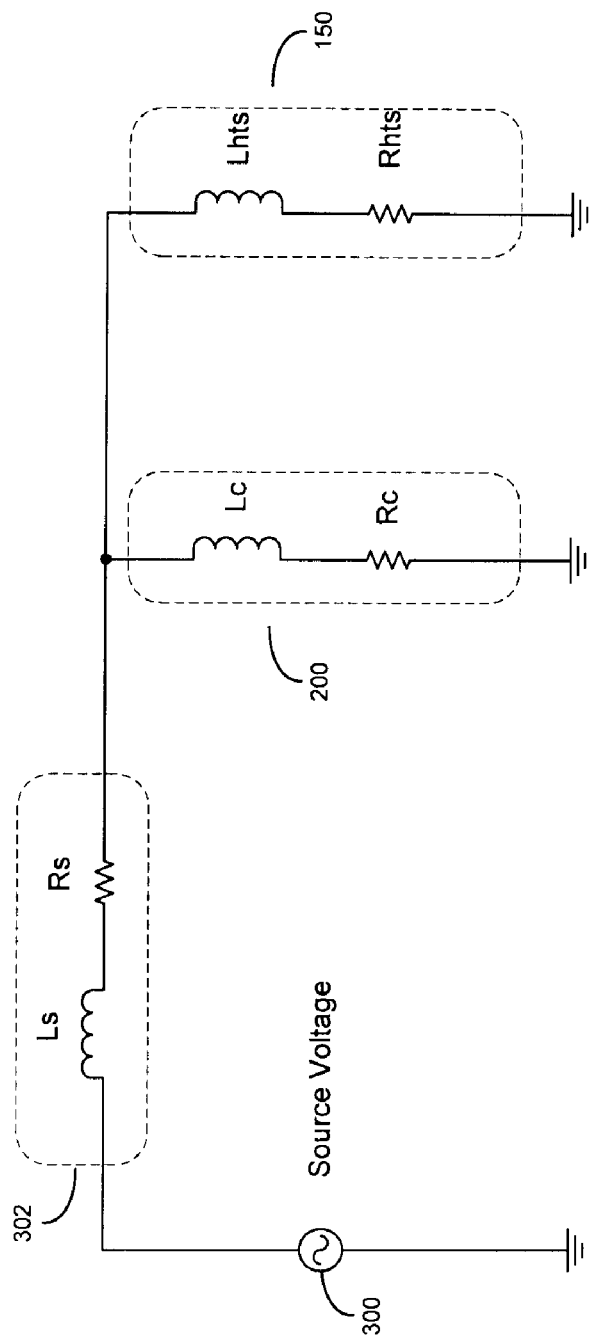
FIG. 6 is a model of a superconducting/conventional cable pair.

Referring also to FIG. 6, when determining how much fault current a particular substation (e.g., 138 kV substation 20) contributes to e.g., fault current 124, the open circuit generation voltage may be modeled as ideal voltage source 300. Further, the impedance of cables 150, 200 may be modeled as their resistive and reactive equivalent circuit elements and upstream impedance may be combined with the transformer impedances and represented as source impedance 302. Impedance in this context may be a complex vector quantity consisting of a real and a reactive component. Mathematically, impedance $Z=R+jX$, where R is the real (i.e., resistive) component and X is the reactive component. In this example, the reactive component is inductive and equal to $j\omega L$, where $\omega=2\pi f$ and f is the frequency of the current flow (e.g. 60 Hz in North America).

The cables may likewise be modeled as a complex impedance. For example, cables 150, 200 are shown terminated to ground because, as discussed above, the fault is modeled as a short circuit to ground. Ohm's Law may be used to determine the expected level of fault current provided by 138 kV substation 20. Using this approach with respect to the other substations with in grid 250, the overall fault current contributions may be calculated and the fault current expected to pass through cable 150 may be determined. The HTS cable 150 and conventional cable 200 may then be designed to limit this otherwise expected fault current 124 to a lower, predetermined level that the conventional circuit breakers are capable of handling.

In designing the HTS device and conventional device to work properly as an FCL, certain criteria should be considered. For example, during a fault condition, HTS cable 150 should be configured to achieve resistance high enough to provide the grid with a sufficient impedance to lower the fault current to the desired level. It also must be high enough relative to the impedance of the conventional cable 200 for the majority of fault current 124 to flow through conventional cable 200. For example, superconducting electrical path 202 may be configured to have a series impedance that is at least N (e.g., greater than 1) times the series impedance of non-superconducting electrical path 204 when superconducting electrical path 202 is operated in its fully resistive state. A typical value for N is >1, and may be higher than 5. In conjunction with the impedance of the conventional parallel link, N may be selected to attenuate the known fault current level by at least 10%.

The design of this voltage divider must be such that the voltage drop across the HTS cable 150 during a fault does not cause the cable temperature to rise to a point where the refrigerant (e.g., liquid nitrogen or other liquid cryogen) changes from a liquid state to a gaseous state. If this were to occur, the dielectric strength of the liquid nitrogen between the high voltage cable core (e.g., HTS layers 102, 104) and the shield (e.g., HTS shield layer 108), would not be maintained and voltage breakdown within HTS cable 150 could occur potentially resulting in damage to the cable.

The criterion that the HTS device achieve a resistance high enough for the majority of the fault current to be directed through the conventional device is achievable due to an adequately high resistivity of HTS wire with its stabilizer after transition from superconducting state to normal (i.e., non-superconducting) state. As with all superconductors, as long as temperature, current density, and magnetic field strength remain below certain critical values, current will flow in the superconductor with essentially zero resistance. However, the heating in the resistive state of the HTS wire increases with the resistivity of the stabilizer. Therefore, the resistivity must be in an intermediate range, as described further below.

Assume that HTS cable 150 is a 2.60 km long HTS cable rated for 2400 A of continuous current at 138 kV. The HTS conductors (e.g., HTS layers 102, 104) of HTS cable 150 may include twenty-eight strands of HTS wire in parallel. Further, assume that cable 150 is constructed using an HTS conductor 0.44 cm wide, laminated with 300 microns of brass (150 microns per side) with a resistivity at 90 K of 5.8 microOhm-cm. Then one strand of this HTS wire has a 90 K resistance of approximately 37.9 Ohms per kilometer (resistivity of the substrate is also accounted for). American Superconductor Corporation has demonstrated the lamination of brass stabilizer to HTS wire. Accordingly, the cable resistance per phase would be 37.9 $\Omega$/km*2.6 km*1.08/28 strands=3.80$\Omega$. The 1.08 factor results from the spiral cabling process that requires each strand be longer than the length of HTS cable 150. For conventional cable 200, the impedance is 2.6 km* (0.095+j0.17)$\Omega$/km=0.25+j0.44$\Omega$. Accordingly, while HTS cable 150 has an impedance value when superconducting that is substantially lower (i.e., 0.00+j0.007$\Omega$/km) than conventional cable 200, when HTS cable 150 is not superconducting (e.g., when a high temperature condition occurs), the impedance of HTS cable 150 is substantially higher (having an impedance of 1.46+j0.007 $\Omega$/km) than conventional cable 200 (having an inductive impedance of 0.095+j0.17 $\Omega$/km).

Figure 7A:
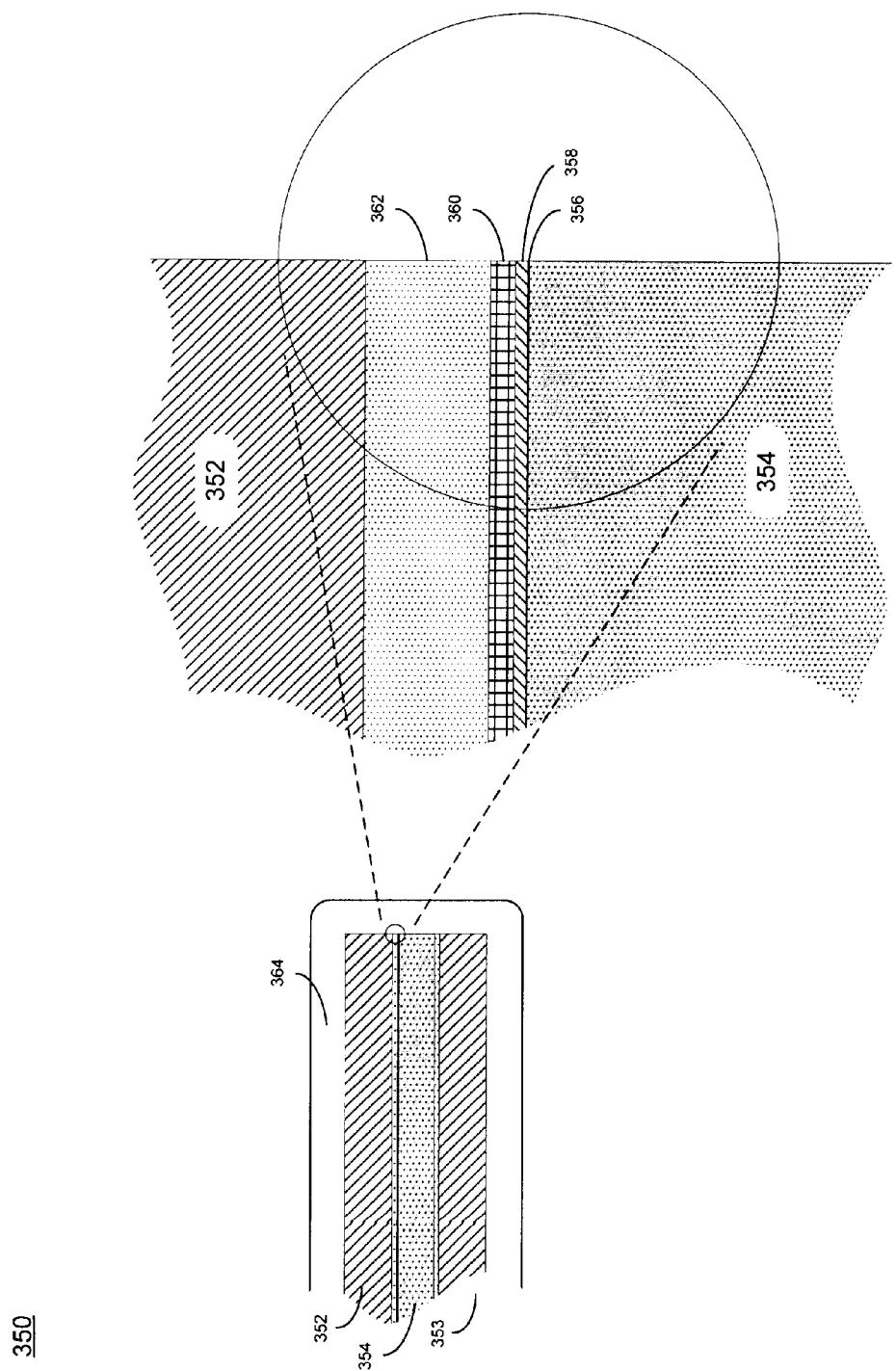
FIG. 7A is a cross-sectional view of an HTS wire.

Referring also to FIG. 7A, there is shown a cross-sectional view of one HTS conductor 350 used to construct HTS layers 102, 104. In this example, HTS conductor 350 used in HTS layers 102, 104 is shown to include two stabilizer layers 352, 353, and substrate 354. An example of stabilizer layers 352, 353 may include but is not limited to brass or other copper or nickel alloys. An example of substrate 354 may include but is not limited to nickel-tungsten, stainless steel, and Hastelloy. Positioned between stabilizer layer 352 and substrate 354 may be buffer layer 356, HTS layer 358 (e.g., a yttrium-barium-copper-oxide layer), and cap layer 360 consisting of e.g., silver. An example of buffer layer 356 is the combination of yttria, yttria-stabilized zirconia, and cerium oxide ($CeO_2$), and an example of cap layer 360 is silver. A solder layer 362 (e.g., a SnPbAg layer) may be used to bond stabilizer layers 352 and 353 to cap layer 360 and substrate layer 354. Other configurations, with additional HTS layers, substrates and stabilizers, as well as possible encapsulants (e.g., encapsulant 364), are also considered within the scope of this invention.

In addition to the above-described wire configuration, other wire configurations are considered to be included within the scope of this disclosure. For example, a single stabilizer layer may be used. Alternatively, a second HTS layer (with its buffer and cap layers, not shown) may be located between second stabilizer layer 353 and the underside of substrate 354. Optionally, the HTS wire may consist of two stabilizer layers positioned on the outside of the HTS wire, with two substrates (each with a buffer layer, an HTS layer, and a cap layer), separated by a third stabilizer layer positioned between the two substrate layers. A solder layer may be used to facilitate any of the required bonds (except possibly between substrate layer 354, buffer layer 356, HTS layer 358 and cap layer 360).

Figure 7B:
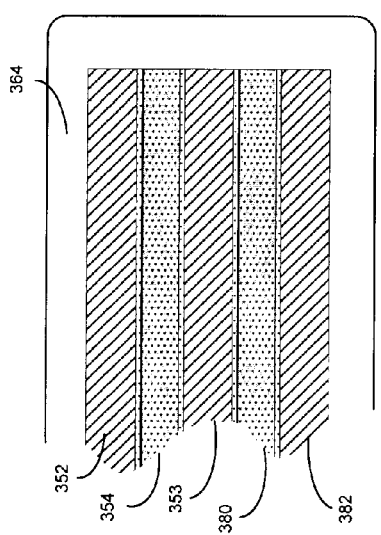
FIG. 7B is a cross-sectional view of an alternative embodiment HTS wire.

Referring also to FIG. 7B, there is shown HTS wire 350', which is an alternative embodiment of HTS wire 350. HTS wire 350' may include a second substrate layer 380 positioned between second stabilizer layer 353 and third stabilizer layer 382. Positioned between stabilizer layer 353 (and/or stabilizer layer 382) and substrate layer 380 may be a buffer layer, an HTS layer (e.g., an yttrium-barium-copper-oxide—YBCO-layer), a cap layer, and a solder layer.

Figure 8:
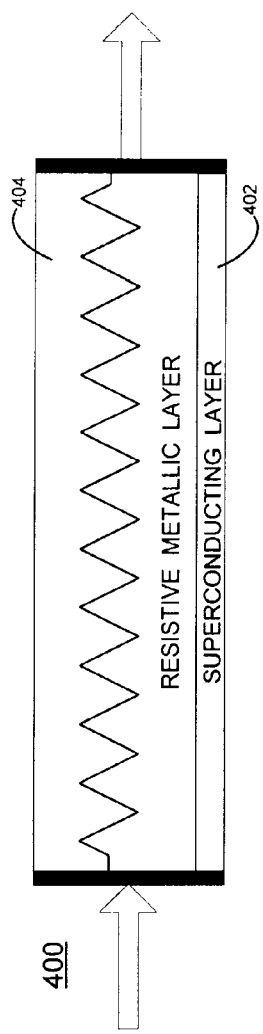
FIG. 8 is a model of the HTS wire of FIG. 7.

Referring also to FIG. 8, an equivalent electrical model 400 of HTS conductor 350 is shown. For illustrative purpose, equivalent electrical model 400 illustrates HTS conductor 350 as a superconducting layer 402 on the lower half of model 400 and all other wire structures combined to form resistive metallic layer 404 on the upper half of model 400. When HTS conductor 350 is in superconducting mode, all current flows within the essentially zero resistance superconducting layer 402. When in non-superconducting mode, current flows within resistive metallic layer 404, consisting principally of the stabilizer.

Figure 9:
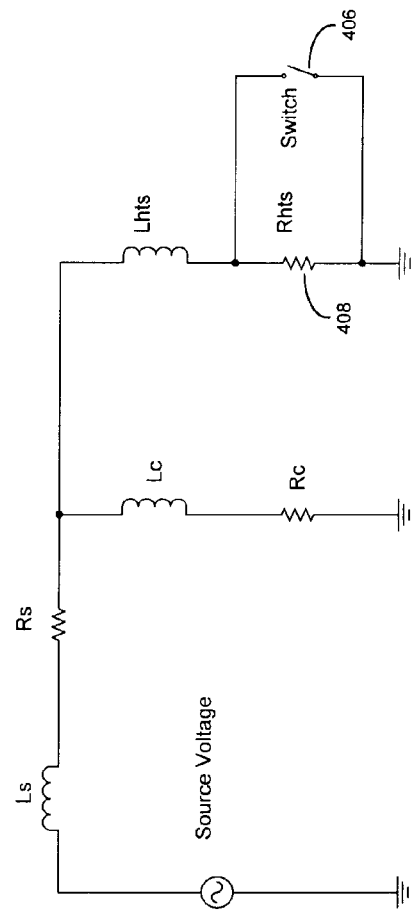
FIG. 9 is an alternative model of the superconducting/conventional cable pair of FIG. 6.

Referring also to FIG. 9 and as discussed above, exceeding a critical current level is what differentiates between HTS conductor 350 functioning in a superconducting mode or in a non-superconducting mode. HTS conductor 350 may be modeled to include a switch 406 that, for low currents (i.e., below the critical current level), is closed and shunts the resistance 408 of metallic layer 404. Accordingly, when switch 406 is closed, all current flows through superconducting layer 402, which is modeled as zero resistance. When the critical current level is exceeded, superconducting layer 402 may become highly resistive and switch 406 may be opened, resulting in all current flowing through resistive metallic layer 404.

Figure 10:
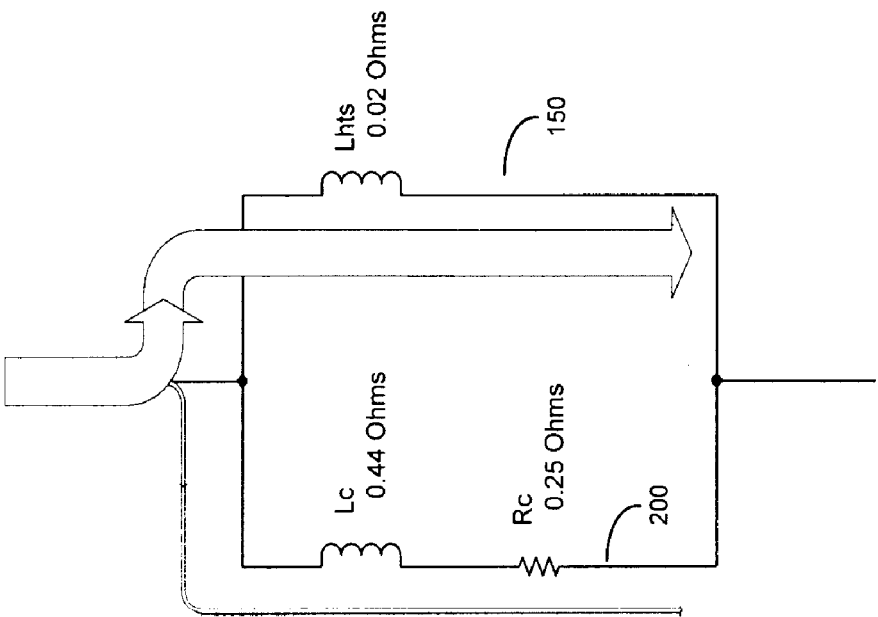
FIG. 10 is a model of the superconducting/conventional cable pair of FIG. 9 during superconducting mode.

Referring also to FIG. 10, there is shown a model of the combination of HTS cable 150 and conventional cable 200 during superconducting operation mode. For this model, assume a typical source voltage of 79.7 kV line-to-ground and a source impedance of 0.155+j1.55 Ohms (Vs, Ls, and Rs in FIG. 6). These values result in a fault current of 51 kA for a fault in substation 20 ahead of cables 150, 200. Inserting typical real and reactive impedance values for e.g., a 2600 meter cable, during normal operation where current (i.e., below the critical current level) flows from one substation to another substation, the switch is closed and 96% of the current flows within HTS cable 150.

Figure 11:
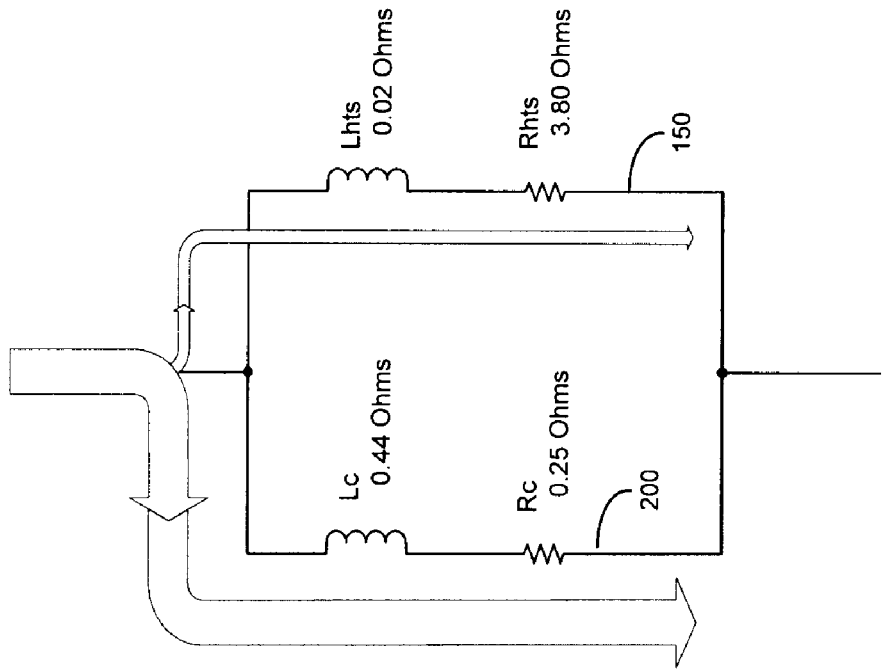
FIG. 11 is a model of the superconducting/conventional cable pair of FIG. 9 during non-superconducting mode.

Referring also to FIG. 11, during a fault condition, the critical current level is met or exceeded, causing switch 410 (FIG. 9) to open. The additional resistance of metallic layer 402 (FIG. 8) of HTS cable 150 may cause the majority of the fault current to flow within conventional cable 200. Specifically, for the values shown, 88% of the fault current flows within conventional cable 200 and 12% within HTS cable 150 when the HTS cable becomes fully resistive. Total fault current flowing in cables 150, 200 is 40 kA which is significantly reduced from the 51 kA available. This 20% reduction in available fault current is typical of what may be required of a fault current limiter.

To prevent HTS cable 150 from heating excessively during a fault, several measures may be taken. Typically, fast switch assembly 208 (FIG. 4), which is in series with the HTS cable 150, may be opened after e.g., 4 cycles, and is only closed after HTS cable 150 cools to an acceptable starting temperature. Alternatively, circuit breakers 34 and/or circuit breaker 36 may be opened.

To further minimize the temperature rise, stabilizer layer 352 (FIG. 7) may be quite thick (e.g., 300 microns) to increase the heat capacity. At the same time, the resistivity of stabilizer layer 352 maybe chosen at a value to minimize the temperature rise due to resistive heating, while at the same time being high enough to insure that in its switched state, HTS cable 150 has a high enough resistance to insure transfer of a majority of fault current 124 (FIG. 5) to conventional cable 200. Typically, values in the range of 0.8-15 microOhm-cm, or more preferably 1-10 microOhm-cm, at around 90 K fulfill these requirements for typical applications. A convenient material family to achieve such values is brass (Cu—Zn alloy), but many other alloys such as CuNi and CuMn are also possible. These values are provided for illustrative purposes only and are not intended to be a limitation of this disclosure. For example, in the case described above, with 28 parallel HTS wires, each 0.44 cm in width and with a total of 300 microns of stabilizer with 5.0 microOhm-cm resistivity provides a resistance of 13 Ohm/km, while the temperature rise during a 4-cycle (0.067 sec) hold time prior to the opening of the fast switch, for an effective critical current of 350 A/cm is about $5 \times 10^{-6} (350/0.03)^2 \times 0.067/(2 \times 2) = 11$ K (assuming an adiabatic temperature rise with a heat capacity of 2 J/cm$^3$K and an f-factor of 1). For a pressurized cable system with pressures in the range of 15-20 bar, nitrogen bubbles above about 110 K; so this temperature rise is acceptable for operation in the 70-80K temperature range. For wires with a lower critical current of about 250 A/cm-width, a resistivity of about 10 microOhm-cm would result in the same temperature rise. For wires with an f-factor of 2, the temperature rise would be approximately 44 K; in this case a resistivity of 3 microOhm-cm would give a temperature rise of approximately 26 K, acceptable for a cable operating below 77 K. For wires with an f-factor of 3, a resistivity of 1 microOhm-cm would give a temperature rise of approximately 20 K.

Therefore, values of stabilizer resistivity in the range of 1-10 microOhm cm are preferred. For a somewhat wider range of starting parameters, the wider resistivity range of 0.8-15 microOhm cm is also possible. These values differ from previous approaches for HTS cable taken in the literature. On the one hand, most HTS cables, designed for protection rather than current limiting, have been constructed with low resistivity copper shunts, which have resistivity in the 77-90 K temperature range below 0.5 microOhm-cm. On the other hand, a previous design for current limiting cable (See *SUPERPOLI Fault-Current Limiters Based on YBCO-Coated Stainless Steel Tapes* by A. Usoskin et al., IEEE Trans. on Applied Superconductivity, Vol. 13, No. 2, June 2003, pp. 1972-5) used either rods or cylinders of superconductor itself, which has a resistivity of around 100 microOhm-cm in the normal resistive state, or of HTS wires stabilized by stainless steel, which has a resistivity of >50 microOhm-cm. The solution of the present invention using an intermediate range of stabilizer resistivities was not previously recognized.

Now consider the example of a 600 m length of the same cable (i.e. 138 kV, 2400 A and constructed the same way with the same wire characteristics). The source voltage and impedance values of FIG. 9 remain unchanged. However, the impedance of conventional cable 200 is 0.57+j0.10 Ohms and the impedance of HTS cable 150 is 0.88+j0.005 Ohms in the non-superconducting state. In this scenario, the fault current is only reduced to 48 kA from 51 kA. To reduce the fault current further, a reactor (e.g., reactor 206) may be inserted in series with conventional cable 200. For example, a 1.4 mH reactor has a impedance of 0+j0.53 Ohms and when that impedance is added to the conventional cable impedance (because they are connected in series), the total fault current flowing in the cables is reduced to 40 kA.

The net effect of fault-current limiting cable 150 is to: limit current in the impacted branch of the cable system to a level no larger than the product of the f-factor and the critical current $I_c$; protect fast switch assembly 208; and divert the remaining fault current to non-superconducting cable 200 and reactor 206. In the above example, without the use of the fault current limiting HTS cable design according to this disclosure, the fault current in the branch of the cable system may be significantly higher (e.g., an order of magnitude greater). However, precise current levels depend on the impedances and power levels within the electrical path. After fast switch assembly 208 opens, non-superconducting cable 200 and reactor 206 pass the fault current until circuit breakers 34, 36 open. Through proper choice of the impedance of non-superconducting cable 200 and reactor 206, the fault current may be limited to the desired level. After superconducting cable 150 recovers to its superconducting state after a few minutes, fast switch assembly 208 may be closed, allowing the system to resume its original operation.

Figure 12:
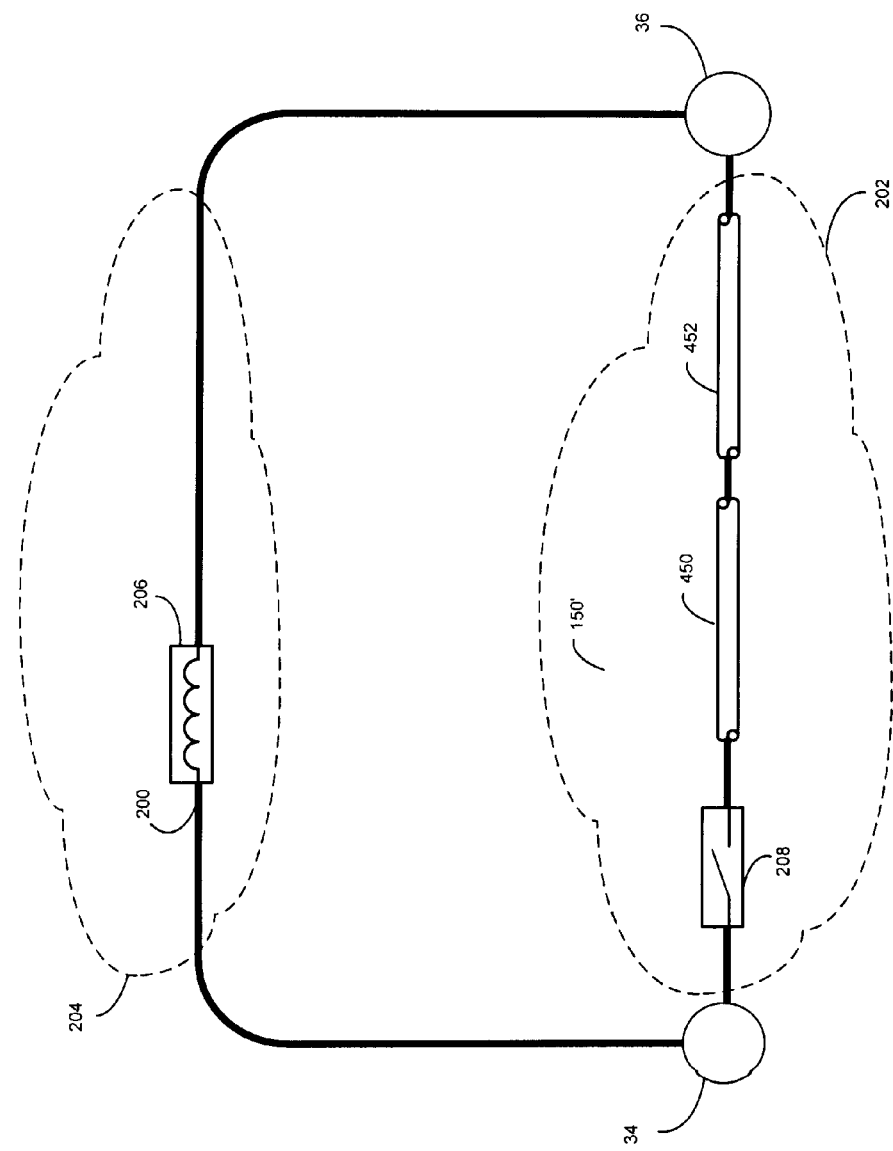
FIG. 12 is a schematic diagram of an alternative embodiment of the hollow-core HTS cable of FIG. 3 installed within a utility power grid.

While superconducting cable 150 is described above as being a single superconducting cable in which the entire cable has common superconducting parameters (e.g., made of a single superconducting material), other configurations are possible and are considered to be within the scope of this disclosure. For example and referring also to FIG. 12, there is shown an alternative embodiment superconducting cable 150' that includes a plurality of distinct superconducting cable portions 450, 452. While alternative embodiment superconducting cable 150' is shown to include two superconducting cable portions 450, 452, this is for illustrative proposes only and is not intended to be a limitation of this disclosure, as the actual number of superconducting cable portions may be increased/decreased depending on application.

Due to the varying transition characteristics of different superconducting materials (i.e., during transition from a superconducting state to a normal state), some superconducting materials by nature are better than others in fault current limiting applications. For example, YBCO (i.e., yttrium-barium-copper-oxide) conductors are typically considered better than BSCCO (i.e., bismuth-strontium-calcium-copper-oxide) conductors for fault current limiting applications due to the higher n-values of YBCO conductors, wherein the n-value of a superconductor is used to reflect the abruptness of the transition from a superconducting state to a normal state. Typical examples of n-values may range from 10-100, with YBCO conductors having an n-value of 25-30 and BSCCO conductors having an n-value of 15-20.

Accordingly, a superconducting cable portion may be constructed of a plurality of superconducting cable portions (e.g., cable portions 450, 452), in which each of superconducting cable portions 450, 452 is constructed using different superconducting materials. For example, superconducting cable portion 450 may be constructed of BSCCO (i.e., bismuth-strontium-calcium-copper-oxide) wires, while superconducting cable portion 452 may be constructed of YBCO (i.e., yttrium- or rare-earth-barium-copper-oxide) wires. Examples of BSCCO cable portion 450 may include, but are not limited to, BSCCO wires manufactured by Sumitomo Electric Industries, Ltd., of Osaka, Japan and American Superconductor Corporation of Westboro, Mass. Examples of YBCO cable portion 452 may include, but are not limited to, YBCO wires manufactured by American Superconductor Corporation of Wesborough, Mass.

Accordingly, while a superconducting cable constructed entirely of BSCCO wires may have limited effectiveness as a fault current limiting device (i.e., due to a low n-value), adding a cable portion that is constructed using a conductor having a higher n-value may result in an overall cable (i.e., the combination of cable portions 450, 452) that is effective as a fault current limiting device. Therefore, by adding a high n-value cable portion (e.g., superconducting cable portion 452 constructed using YBCO wires) to an existing low n-value cable portion (e.g., superconducting cable portion 450 constructed using BSCCO wires), a fault current limiting superconducting cable 150' may be realized. In this configuration, the high n-value transition characteristics of cable portion 452 may be used to achieve the desirable fault current limiting effects within superconducting cable 150' (which includes low n-value cable portion 450).

As discussed above, this disclosure may be applied to other HTS devices, such as superconducting transformers. For example, a superconducting transformer may be coupled in parallel with a conventional transformer.

Figure 13:
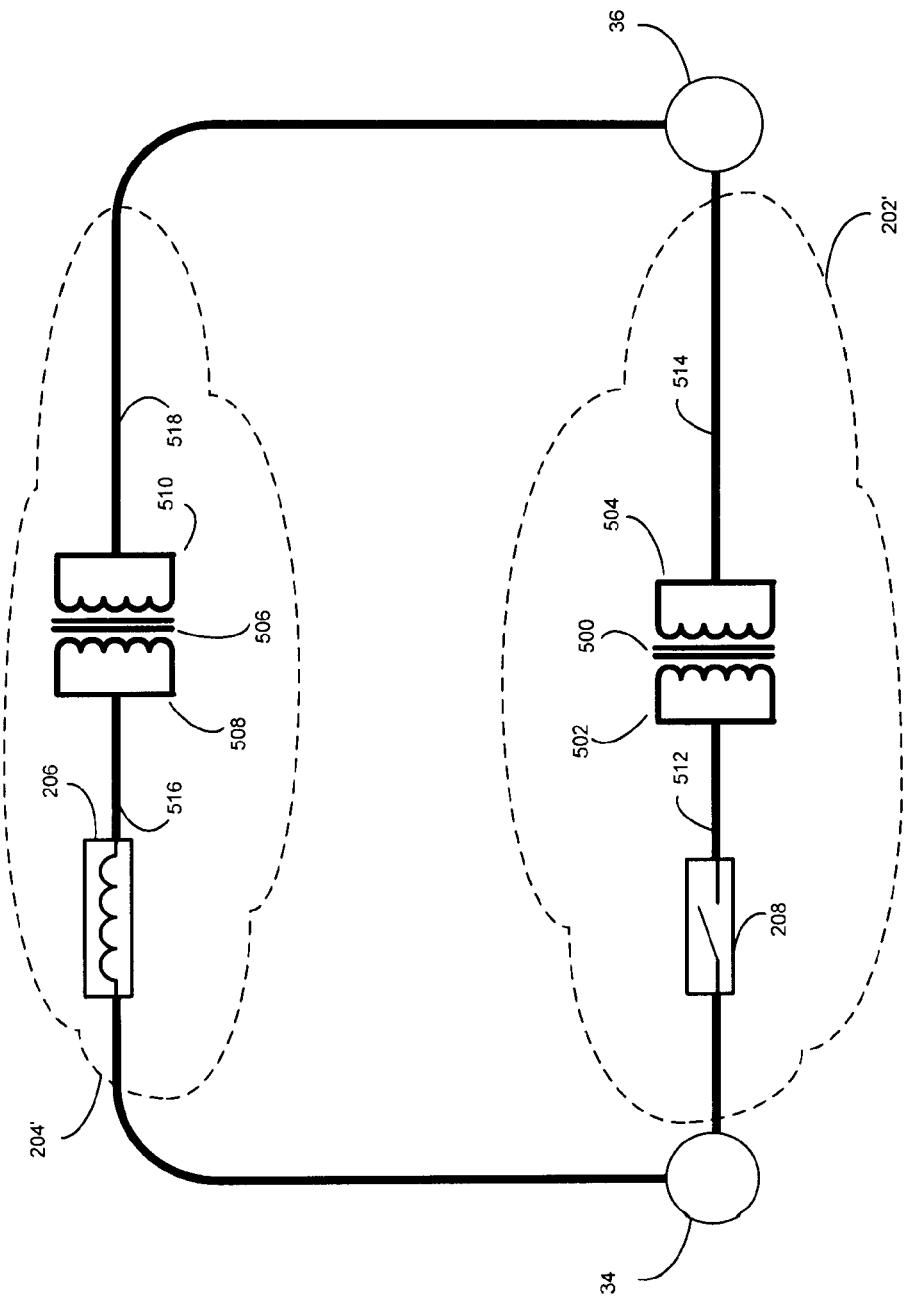
FIG. 13 is a schematic diagram of a superconducting/conventional transformer pair installed within a utility power grid.

Referring also to FIG. 13, superconducting electrical path 202' may include superconducting transformer 500 having primary coils 502 and/or secondary coils 504 wound from HTS wire (as described above). Additionally, non-superconducting electrical path 204' may include non-superconducting transformer 506 having conventional primary coils 508 and conventional secondary coils 510. Superconducting transformer 500 and/or non-superconducting transformer 506 may be configured as step-up transformers, step-down transformers, isolating transformers, or variable transformers.

Superconducting transformer 500 may be coupled with breakers 34, 36 using superconducting cable 512, superconducting cable 514 and/or rigid busbars (not shown). Superconducting electrical path 202' may include one or more fast switch assemblies (e.g., fast switch assembly 208) coupled in series with superconducting transformer 500. Fast switch assembly 208 may be positioned within e.g., superconducting cable 512, superconducting cable 514, or a busbar (not shown). Conventional cables may also be used with the superconducting transformer in superconducting electrical path 202'.

Non-superconducting transformer 506 may be coupled with breakers 34, 36 using non-superconducting cable 516, non-superconducting cable 518 and/or rigid busbars (not shown). Non-superconducting electrical path 204' may include one or more reactor assemblies (e.g., reactor assembly 206) coupled in series with non-superconducting transformer 506. Reactor assembly 206 may be positioned within e.g., non-superconducting cable 516, non-superconducting cable 518, or a busbar (not shown).

Due to primary coils 502 and/or secondary coils 504 of superconducting transformer 500 being wound from HTS wire (as described above), superconducting electrical path 202' will have a lower series impedance than non-superconducting electrical path 204' when operated below a critical current level $I_c$ (described above) and a critical temperature (described above) of superconducting transformer 500. Specifically, during operation below this critical current level $I_c$/critical temperature, the series impedance of superconducting cables 512, 514 and superconducting transformer 500 is below that of the series impedance of non-superconducting cables 516, 518 and non-superconducting transformer 506. The reduced superconducting transformer inductive impedance arises in part from the high current density of HTS wire, allowing the primary and secondary coils to be more compact than in conventional copper transformers, and a reduced superconductor transformer resistive impedance arises from the low resistance of the HTS wires.

For example, a 10 MVA-rated HTS transformer could have a 2% per unit (pu) impedance, primarily inductive. 2% per unit refers to the equivalent circuit impedance from primary to secondary expressed as a per-unit (percentage) of the transformers base power rating. The parallel conventional transformer may be chosen to be transient-rated, hence lower base-rated. For example, this could be a 2 MVA-rated transformer with an 8% impedance, primarily inductive. In this case, the impedance ratio between the superconducting and non-superconducting electrical paths is (0.02/0.08)(2 MVA/10 MVA)=0.05. Accordingly, the vast majority of current and power flows through the superconducting path. In this case, the single phase impedance of a 13.8 kV-secondary 2% pu 10 MVA HTS transformer will be 0.072 Ohms, while the corresponding impedance of a 13.8 kV-secondary, 8% pu 2 MVA transformer will be 1.44 Ohms.

As discussed above, in the event of a fault condition (e.g., the current passing through superconducting transformer 500 exceeds the f-factor times $I_c$), and/or an over-temperature condition (i.e., the temperature of superconducting transformer 500 exceeds the superconductor critical temperature), the HTS wire within the superconducting devices will go normal (i.e., resistive) and the series impedance of superconducting electrical path 202' may be at least N times the series impedance of non-superconducting electrical path 204'.

As discussed above, N is greater than 1 (and may be as high as 5 or more) and is selected in conjunction with the series impedance of non-superconducting electrical path 204' to attenuate the known fault current (e.g., fault current 124, FIGS. 2, 3, 5) by at least 10%.

For example, let us consider a design for superconducting transformer 500 such that its normal impedance is 3.7 Ohms, and assuming that all of this impedance comes from the secondary windings with seven 100 m lengths of HTS wire in parallel, the resistance of each HTS wire would need to be 26 Ohms. As an example, we consider the same architecture of wire as discussed for the HTS cable case, namely a coated conductor architecture with a 0.44 cm wire and 350 Amps/cm-width at the operating temperature in liquid nitrogen. In this case, we assume that the temperature of the HTS wire can increase up to room temperature or even beyond during a fault event because the spacing between the coils may be larger than between the phases of an HTS cable, and an insulator may be used on the wire, making it permissible to allow the liquid nitrogen to boil. In the example above, a stabilizer of stainless steel with 50 microOhm-cm at 90 K, a total of 440 microns thick (two 220 micron thick layers on either side of the substrate, buffer, HTS and cap layers) provides the required resistance. The temperature rise with a fault hold time of 0.067 sec, a specific heat of 2 J/cm$^3$K and an f-factor of 2 may be estimated to be 213 K (this result is approximate because it ignores temperature dependences in the various parameters).

In general for this application, the resistivity of the stabilizer, as much as in the case of a standalone fault current limiter (See W. Schmidt et al., Investigation of YBCO Coated Conductors for Fault Current Limiter Applications, Proceedings of the Applied Superconductivity Conference, Seattle, Wash., Aug. 28-Sep. 1, 2006, to be published in IEEE Trans. On Applied Superconductivity) must be high (e.g., in the range of 30 microOhm-cm or higher) and the stabilizer must be thick (e.g., with a total thickness of 200-500 microns or more). If the thickness of the stabilizer becomes too great, it will inhibit the flexibility required for cabling. A variety of alloys are possible for the stabilizer strips, including but not limited to stainless steel, Inconel and Hastelloy.

In order to provide for adequate flexibility in cabling, these strips may be in a soft temper state, for example ½ or ¼ hard. The strips may be applied by e.g., solder lamination or adhesive bonding. They may also be applied by a coating method such as dipping, plating, vapor deposition, electrodeposition, metal-organic liquid-phase deposition or spraying, as either a metal or composite.

The fault hold time of e.g., 0.067 sec is achieved through the use of fast switch 208 in parallel with superconducting transformer 500. During this time, the current through superconducting transformer 500 is limited to a value of the f-factor times the Ic of transformer 500. Once fast switch 208 opens, all current is diverted to non-superconducting electrical path 204'. The current is now limited by the impedance of non-superconducting transformer 506 and optional reactor assembly 206 or any other electrical elements in non-superconducting electrical path 204'. The impedance of non-superconducting transformer 506 and/or reactor assembly 206 may be chosen to limit the current to the required value. During this time, system circuit breakers 34, 36 may also open if the short circuit is a bolted fault, that is, if it does not spontaneously clear. Multiple reclosings may be performed if necessary. Since the recovery time of FCL-superconducting transformer 500 is relatively short as discussed below, non-superconducting transformer 506 may be transient rated and handle a significantly higher power flow than its rating for continuous duty operation.

While fast switch 208 is open, superconducting transformer 500 may begin to recover. The recovery may be faster than in the case of a superconducting cable because of the larger amount of liquid nitrogen in immediate proximity to the windings of transformer 500, and a time of 10's of seconds is estimated, based on recent results on stainless steel stabilized coils in a standalone fault current limiter (See W. Schmidt et al., Investigation of YBCO Coated Conductors for Fault Current Limiter Applications, Proceedings of the Applied Superconductivity Conference, Seattle, Wash., Aug. 28-Sep. 1, 2006, to be published in IEEE Trans. On Applied Superconductivity). Once superconducting transformer 500 recovers to its superconducting state, fast switch 208 closes, and power flows again predominantly through it.

It is desirable to reduce the temperature rise of the HTS wire in superconducting transformer 500 so as to minimize the thermal shock on the wire and to shorten the recovery time. One way to do this is to further increase the heat capacity of the wire, beyond what is achieved with the metal stabilizer (stainless steel, etc.). Additional specific heat may be provided by optionally adding an insulator layer deposited or wrapped around the stabilized HTS wire to encapsulate it, which is commonly referred to as an encapsulant (e.g., encapsulant 364, FIGS. 7A & 7B). Encapsulant 364 may form a liquid-impermeable layer of generally limited heat transfer coefficient to delay heat introduction into the surrounding liquid coolant (liquid nitrogen), thus allowing the temperature of the HTS wire to thermalize i.e., become uniform across its cross section and minimize any hot spots. The surface of the HTS wire may also be optimized with surface features and surface chemistry to inhibit the onset of liquid nitrogen bubbling.

Encapsulant 364 may be a polymer such as polyethylene, polyester, polypropylene, epoxy, polymethyl methacrylate, polyimides, polytetrafluoroethylene, polyurethane, and so on, including common electrically insulating materials. The thickness of encapsulant 364 may be selected to trade off the total time of cooling the wire down by heat transfer into the liquid nitrogen against the need to attain the highest possible temperature in the wire without forming liquid nitrogen bubbles at the surface. Typical thickness of encapsulant 364 may be in the range of 25 to 300 micrometers, more preferably in the 50 to 150 micrometer range.

Surface coating additions on the outside of encapsulant 364 may include those chemicals that are not well wetted by liquid nitrogen to decrease the heat transfer coefficient into the liquid nitrogen. In contrast to the case for cables where no bubbling is expected, here the temperature may increase well above the bubbling point. In this case the surface should be optimized to minimize voltage breakdown, which requires that it be as smooth as possible, with no sharp edges.

Encapsulant 364 may be applied by various wrapping or coating methods, including for example multi-pass approaches that statistically reduce the incidence of perforations in comparison to single pass approaches. The impermeable coating may be applied while the HTS wire is in considerable axial tension, which (upon completion) puts the coating into compression, thus reducing the likelihood of perforations. In the final product, the insulation may be in axial compression while the enclosed HTS wire is in residual tension (as compared to its initial state). In some cases, this coating may also be applied by a coating method such as dipping, plating, vapor deposition or spraying.

In the case of a wrapped coating, a final step may be the application of an additional, impregnating coating that penetrates the gaps and occasional openings into the wrapped layers with an impermeable material (e.g., a polymer, paint or varnish) in order to make it hermetic. The wrapped layer may also be made hermetic by application of rolling or other means of compression like iso-static pressing to seal up occasional openings.

Another class of encapsulants or stabilizers are materials that undergo an endothermic phase transition such as melting or crystal structure phase transition. Use of a material that undergoes an endothermic phase change at some temperature above the operating temperature of the wire, but below the maximum allowable temperature of the wire in the design is preferred. An example of an endothermic phase change is melting, for example of low melting temperature organic or inorganic materials, that may be added either as discrete embedded particles in a composite reinforcement material or as gels or paints that may be applied to: surface or interfaces of the composite; certain regions of the composite (e.g., edges or fillets between the overhanging edge regions of the lamina strips); or in internal conduit regions of the reinforcement strips.

Endothermic phase changes may also include e.g., certain intermetallic phase changes, ordering phase changes or other second order phase transitions. For example, the material selected may melt in the −160 to −70 C range, while boiling above about −50 C. More preferably, boiling should be above ambient temperature (e.g., ~20 C), so as to make application relatively easy and economical in the liquid/composite state as paint, film coating, emulsion or gel. The boiling temperature may also be increased as encapsulant 364 (including the phase change material) is in compression.

In another implementation, each of the coils of the primary and/or secondary windings of superconducting transformer 500 may include two or more coil sections. One section may include the above-described coated HTS wires, which have high resistance and high heat capacity in their normal state. However, the other section(s) may include other HTS wires having a lower resistance. These other HTS wires may be chosen for optimizing other properties e.g., ac losses on the ends of the solenoidal windings, as described in U.S. Pat. No. 5,912,607, entitled "Fault Current Limiting Superconducting Coil". Various combinations of HTS wires with different HTS materials, such as BSCCO and YBCO, may also be used.

A number of implementations have been described. Nevertheless, it will be understood that various modifications may be made. Accordingly, other implementations are within the scope of the following claims.

What is claimed is:

1. A superconducting transformer system configured to be included within a utility power grid having a known fault current level, the superconducting transformer system comprising:

a non-superconducting transformer interconnected between a first node and a second node of the utility power grid; and a superconducting transformer interconnected between the first node and the second node of the utility power grid, the superconducting transformer and the non-superconducting transformer being electrically connected in parallel, and the superconducting transformer having a lower series impedance than the non-superconducting transformer when the superconducting transformer is operated below a critical current level and a critical temperature, the superconducting transformer including one or more HTS wires, wherein at least one of the one or more HTS wires includes one or more stabilizer layers having a total thickness within a range of 200-500 microns and a resistivity within a range of approximately 0.8-15.0 microOhm-cm at approximately 90K;

wherein the superconducting transformer is configured to have a series impedance that is at least N times the series impedance of the non-superconducting transformer when the superconducting transformer is operated at or above one or more of the critical current level and the critical temperature, wherein N is greater than 1 and is selected to attenuate, in conjunction with an impedance of the non-superconducting transformer, the known fault current level by at least 10%.

2. The superconducting transformer system of claim 1 wherein the non-superconducting transformer is maintained at a non-cryogenic temperature.

3. The superconducting transformer system of claim 2 wherein the non-cryogenic temperature is at least 273 K.

4. The superconducting transformer system of claim 1 further comprising:

an impedance adjustment device coupled in series with the non-superconducting transformer and configured to limit the fault current level to a desired value.

5. The superconducting transformer system of claim 4 wherein the impedance adjustment device includes a reactor assembly.

6. The superconducting transformer system of claim 1 further comprising:

a fast switch assembly coupled in series with the superconducting transformer.

7. The superconducting transformer system of claim 1 wherein N is greater than or equal to 3.

8. The superconducting transformer system of claim 1 wherein N is greater than or equal to 5.

9. The superconducting transformer system of claim 1 further comprising at least one non-superconducting electrical cable coupled in series with the non-superconducting transformer.

10. The superconducting transformer system of claim 1 further comprising at least one superconducting electrical cable coupled in series with the superconducting transformer.

11. The superconducting transformer system of claim 1 wherein at least one of the one or more HTS wires is constructed of a material chosen from the group consisting of: yttrium- or rare-earth-barium-copper-oxide; thallium-barium-calcium-copper-oxide; bismuth-strontium-calcium-copper-oxide; mercury-barium-calcium-copper-oxide; and magnesium diboride.

12. The superconducting transformer system of claim 1 wherein at least one of the stabilizer layers includes a total thickness within a range of 200-500 microns and a resistivity within a range of approximately 1-10 microOhm-cm at 90 K.

13. The superconducting transformer system of claim 12 wherein the stabilizer layer is constructed, at least in part, of a material chosen from the group consisting of stainless steel, austenitic nickel-chromium-based superalloys, and corrosion-resistant metal alloys.

14. The superconducting transformer system of claim 12 wherein at least one of the one or more HTS wires includes a high heat capacity insulating encapsulant.

15. The superconducting transformer system of claim 14 wherein the high heat capacity insulating encapsulant includes a polymer material.

16. The superconducting transformer system of claim 1 wherein at least one of the one or more HTS wires is configured to operate in a superconducting mode below a critical current level.

17. The superconducting transformer system of claim 1 wherein at least one of the one or more HTS wires is configured to operate in a non-superconducting mode at or above the critical current level.

18. A superconducting transformer system configured to be included within a utility power grid having a known fault current level, the superconducting transformer system comprising:
   a non-cryogenic, non-superconducting transformer interconnected between a first node and a second node of the utility power grid; and
   a superconducting transformer interconnected between the first node and the second node of the utility power grid, the superconducting transformer and the non-superconducting transformer being electrically connected in parallel, and the superconducting transformer having a lower series impedance than the non-superconducting transformer when the superconducting transformer is operated below a critical current level and a critical temperature, the superconducting transformer including one or more HTS wires, wherein at least one of the one or more HTS wires includes one or more stabilizer layers having a total thickness within a range of 200-500 microns and a resistivity within a range of approximately 0.8-15.0 microOhm-cm at approximately 90K;
   wherein the superconducting transformer is configured to have a series impedance that is at least N times the series impedance of the non-superconducting transformer when the superconducting transformer is operated at or above one or more of the critical current level and the critical temperature, wherein N is greater than 1.

19. The superconducting transformer system of claim 18 wherein at least one of the one or more HTS wires is constructed of a material chosen from the group consisting of: yttrium- or rare-earth-barium-copper-oxide; thallium-barium-calcium-copper-oxide; bismuth-strontium-calcium-copper-oxide; mercury-barium-calcium-copper-oxide; and magnesium diboride.

20. The superconducting transformer system of claim 18 wherein at least one of the stabilizer layers includes a total thickness within a range of 200-500 microns and a resistivity within a range of approximately 1-10 microOhm-cm at 90 K.

* * * * *